(12) United States Patent
Okada et al.

(10) Patent No.: US 12,132,040 B2
(45) Date of Patent: **\*Oct. 29, 2024**

(54) SEMICONDUCTOR STORAGE DEVICE

(71) Applicant: Kioxia Corporation, Tokyo (JP)

(72) Inventors: Nobuaki Okada, Kanagawa (JP); Tetsuaki Utsumi, Kanagawa (JP)

(73) Assignee: Kioxia Corporation, Tokyo (JP)

(\*) Notice: Subject to any disclaimer, the term of this patent is extended or adjusted under 35 U.S.C. 154(b) by 0 days.

This patent is subject to a terminal disclaimer.

(21) Appl. No.: 18/330,258

(22) Filed: Jun. 6, 2023

(65) Prior Publication Data

US 2023/0317709 A1 Oct. 5, 2023

Related U.S. Application Data

(63) Continuation of application No. 17/003,694, filed on Aug. 26, 2020, now Pat. No. 11,710,727.

(30) Foreign Application Priority Data

Sep. 18, 2019 (JP) .................................. 2019-169250

(51) Int. Cl.
*H01L 25/18* (2023.01)
*G11C 16/04* (2006.01)
(Continued)

(52) U.S. Cl.
CPC .............. *H01L 25/18* (2013.01); *G11C 16/30* (2013.01); *H01L 24/03* (2013.01); *H01L 24/05* (2013.01);
(Continued)

(58) Field of Classification Search
CPC ......... H01L 25/18; H01L 24/03; H01L 24/05; H01L 24/08; H01L 24/09;
(Continued)

(56) References Cited

U.S. PATENT DOCUMENTS 9,558,945 B2 1/2017 Fukuzumi et al.
10,276,585 B2 4/2019 Utsumi
(Continued)

FOREIGN PATENT DOCUMENTS

JP 2018026518 A 2/2018
JP 2019057532 A 4/2019

*Primary Examiner* — Allison Bernstein
(74) *Attorney, Agent, or Firm* — Kim & Stewart LLP

(57) ABSTRACT

A semiconductor storage device includes first and second chips and first and second power supply electrodes. The first chip includes conductive layers arranged in a first direction, a semiconductor pillar extending in the first direction and facing the conductive layers, first contacts extending in the first direction and connected to the conductive layers, second contacts extending in the first direction and connected to a first power supply electrode, third contacts extending in the first direction, facing the second contacts in a direction crossing the first direction, and connected to the second power supply electrode, and first bonding electrodes connected to the first contacts. The second chip includes a semiconductor substrate, transistors provided on the semiconductor substrate, fourth contacts connected to the transistors, and second bonding electrodes connected to the fourth contacts. The first and second chips are bonded together so that respective first and second bonding electrodes are connected together.

20 Claims, 21 Drawing Sheets

(51) Int. Cl.
*G11C 16/30* (2006.01)
*H01L 23/00* (2006.01)

(52) U.S. Cl.
CPC .............. *H01L 24/08* (2013.01); *H01L 24/09* (2013.01); *G11C 16/0483* (2013.01); *H01L 2224/03452* (2013.01); *H01L 2224/0557* (2013.01); *H01L 2224/05572* (2013.01); *H01L 2224/08145* (2013.01); *H01L 2224/09133* (2013.01); *H01L 2224/09134* (2013.01); *H01L 2224/09177* (2013.01); *H01L 2224/09181* (2013.01); *H01L 2924/1431* (2013.01); *H01L 2924/14511* (2013.01)

(58) Field of Classification Search
CPC ... H01L 2224/03452; H01L 2224/0557; H01L 2224/05572; H01L 2224/08145; H01L 2224/09133; H01L 2224/09134; H01L 2224/09177; H01L 2224/09181; H01L 2924/1431; H01L 2924/14511; H01L 2224/05624; H01L 2224/05647; H01L 2224/80357; H01L 25/0657; H01L 2224/04042; H01L 2224/06181; H01L 2224/32145; H01L 2224/32225; H01L 2224/48145; H01L 2224/48227; H01L 2224/49175; H01L 2225/06506; H01L 2225/0651; H01L 2225/06524; H01L 2225/06541; H01L 2225/06565; H01L 2224/73265; H01L 2225/06562; G11C 16/30; G11C 16/0483; H10B 41/27; H10B 41/50; H10B 43/27; H10B 43/50; H10B 41/35; H10B 41/41; H10B 43/35; H10B 43/40

See application file for complete search history.

(56) References Cited

U.S. PATENT DOCUMENTS

| | | |
|---|---|---|
| 11,557,601 B2 | 1/2023 | Zhang |
| 2019/0088676 A1 | 3/2019 | Tagami et al. |
| 2022/0068850 A1 | 3/2022 | Akou |
| 2022/0077088 A1 | 3/2022 | Okada et al. |
| 2023/0083158 A1 | 3/2023 | Matoba et al. |

SEMICONDUCTOR STORAGE DEVICE

CROSS-REFERENCE TO RELATED APPLICATION(S)

This application is a continuation of U.S. patent application Ser. No. 17/003,694, filed Aug. 26, 2020, which is based upon and claims the benefit of priority from Japanese Patent Application No. 2019-169250, filed Sep. 18, 2019, the entire contents of which are incorporated herein by reference.

FIELD

Embodiments described herein relate generally to a semiconductor storage device.

BACKGROUND

A semiconductor storage device including a first chip and a second chip connected to each other has been known. The first chip includes a plurality of first conductive layers stacked in a first direction, a semiconductor pillar extending in the first direction through the plurality of first conductive layers, a plurality of contacts extending in the first direction and connected to the plurality of first conductive layers, and a plurality of first bonding electrodes connected to the plurality of first conductive layers via the plurality of contacts. The second chip includes a semiconductor substrate having a front surface that intersects the first direction, a plurality of transistors provided on the semiconductor substrate, a plurality of contacts extending in the first direction and connected to the plurality of transistors, and a plurality of second bonding electrodes connected to the plurality of transistors via the plurality of contacts. The first chip and the second chip are arranged such that the plurality of first bonding electrodes face the plurality of second bonding electrodes, and the plurality of first bonding electrodes are connected to the plurality of second bonding electrodes.

DETAILED DESCRIPTION

Figure 1:
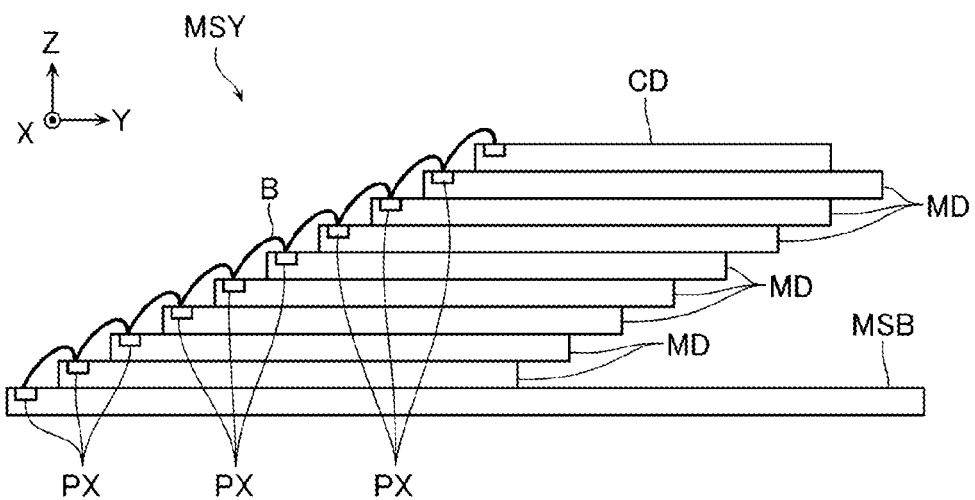
FIG. 1 is a schematic side view illustrating a semiconductor storage device according to a first embodiment.

Embodiments provide a semiconductor storage device operating at high speeds.

In general, according to one embodiment, there is provided a semiconductor storage device including a first chip and a second chip connected to each other, and a first power supply electrode and a second power supply electrode provided on at least one of the first chip and the second chip. The first chip includes a plurality of first conductive layers arranged in a first direction, a semiconductor pillar extending in the first direction and facing the plurality of first conductive layers, a plurality of first contacts extending in the first direction and connected to the plurality of first conductive layers, a plurality of second contacts extending in the first direction and connected to the first power supply electrode, a plurality of third contacts extending in the first direction and connected to the second power supply electrode, and a plurality of first bonding electrodes connected to the plurality of first conductive layers via the plurality of first contacts. The second chip includes a semiconductor substrate having a front surface that intersects the first direction, a plurality of transistors provided on the front surface of the semiconductor substrate, a plurality of fourth contacts extending in the first direction and connected to the plurality of transistors, and a plurality of second bonding electrodes connected to the plurality of transistors via the plurality of fourth contacts. The first chip and the second chip are arranged such that the plurality of first bonding electrodes face the plurality of second bonding electrodes, and the plurality of first bonding electrodes are connected to the plurality of second bonding electrodes. The plurality of second contacts face the plurality of third contacts in a direction crossing the first direction.

Next, a semiconductor storage device according to embodiments will be described in detail with reference to the accompanying drawings. The following embodiments are merely examples, and are not intended to limit the scope of the present disclosure.

In this specification, a predetermined direction parallel to a front surface of a semiconductor substrate is referred to as the X-direction, a direction parallel to the front surface of the semiconductor substrate and perpendicular to the X-direction is referred to as the Y-direction, and a direction perpendicular to the front surface of the semiconductor substrate is referred to as the Z-direction.

In this specification, a direction along a predetermined plane may be referred to as a first direction, a direction intersecting the first direction along the predetermined plane may be referred to as a second direction, and a direction intersecting the predetermined plane may be referred to as a third direction. The first direction, the second direction, and the third direction may or may not correspond to any of the X-direction, the Y-direction, and the Z-direction.

In this specification, expressions such as "upper" and "lower" specify directions relative to a semiconductor substrate. For example, when the first direction intersects the front surface of the semiconductor substrate, a direction away from the semiconductor substrate along the first direction is referred to as "upper", and a direction approaching the semiconductor substrate along the first direction is referred to as "lower". When referring to a lower surface or lower end portion of a certain configuration, it means a surface or end portion on the semiconductor substrate side of this configuration, and when referring to an upper surface or upper end portion, it means a surface or end portion on a side opposite to the semiconductor substrate of this configuration. A surface intersecting the second direction or the third direction is referred to as a side surface and the like.

In this specification, when a first configuration is said to be "electrically connected" to a second configuration, the first configuration may be directly connected to the second configuration, or alternatively, the first configuration may be connected to the second configuration via a wiring, a semiconductor member, a transistor, or the like. For example, when three transistors are connected in series, a first transistor is "electrically connected" to a third transistor even if a second transistor is in an OFF state.

In this specification, when a circuit or the like is said to "electrically connect" two wirings or the like, for example, it may mean that the circuit or the like includes a transistor or the like, and the transistor or the like is provided in a current path between two wirings, and the transistor or the like enters an ON state.

In this specification, when the first configuration is said to be "electrically insulated" from the second configuration, for example, it means a state in which an insulating film or the like is provided between the first configuration and the second configuration, and a contact, a wiring, or the like that connects the first configuration and the second configuration is not provided.

In this specification, when referring to a "field-effect type transistor" or a "field-effect transistor", it means a transistor including a semiconductor layer functioning as a channel region, a gate insulating film, and a gate electrode.

First Embodiment

Hereinafter, the configuration of a semiconductor storage device according to a first embodiment will be described with reference to the drawings. The following drawings are schematic and a part of the configuration may be omitted for convenience of explanation.

Memory System MSY

Figure 2:
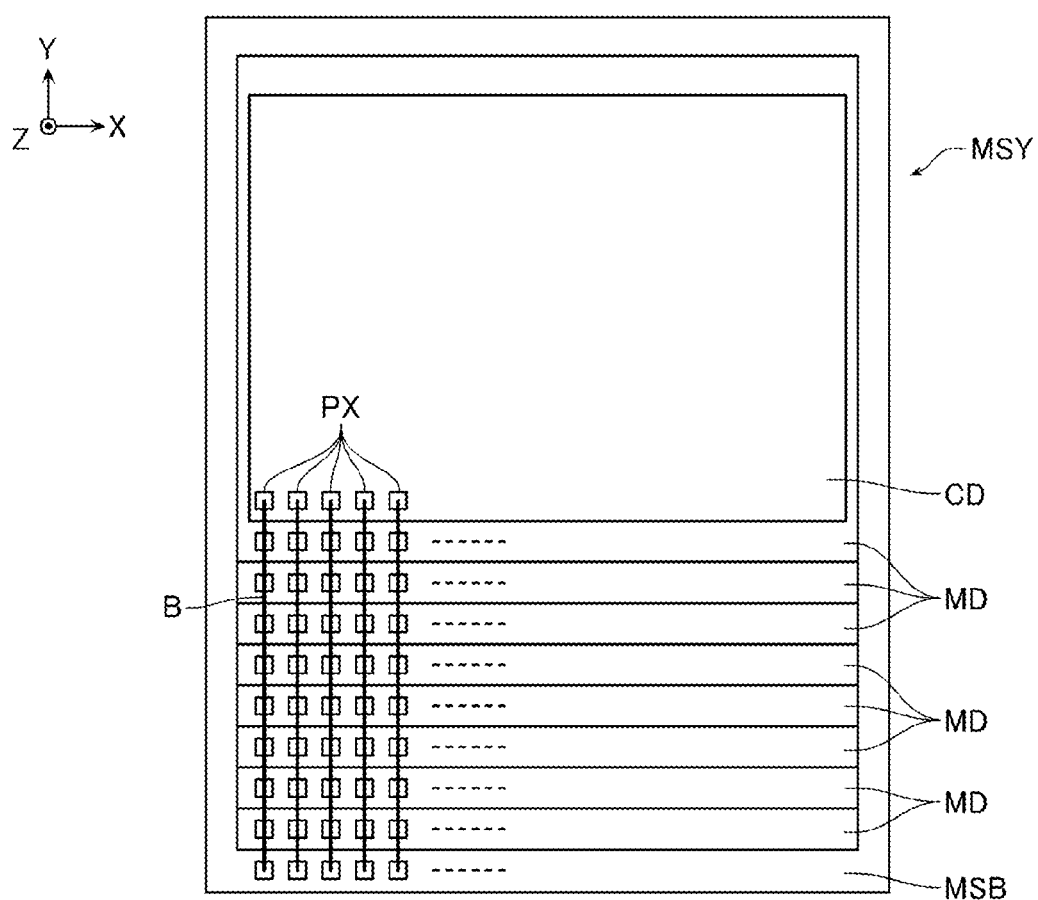
FIG. 2 is a schematic plan view of the semiconductor storage device.

FIG. 1 is a schematic side view illustrating a configuration example of the semiconductor storage device according to the first embodiment. FIG. 2 is a schematic plan view illustrating the configuration example of the semiconductor storage device according to the first embodiment.

As illustrated in FIG. 1, a memory system MSY according to the first embodiment includes a mounting substrate MSB, a plurality of memory dies MD stacked on the mounting substrate MSB, and a control die CD stacked on the uppermost memory die MD. These configurations are stacked so as to be shifted in the Y-direction so that external pad electrodes PX formed on the upper surface via an adhesive or the like are exposed and are connected to each other.

As illustrated in FIG. 2, the mounting substrate MSB, the plurality of memory dies MD, and the control die CD include a plurality of external pad electrodes PX, respectively. The plurality of external pad electrodes PX provided on the mounting substrate MSB, the plurality of memory dies MD, and the control die CD are connected to each other via bonding wires B.

The memory system MSY is, for example, a memory chip, a memory card, or another system that can store user data.

The plurality of memory dies MD store user data. The plurality of memory dies MD execute a read operation, a write operation, an erase operation, or the like of user data according to a control signal of the control die CD.

The control die CD includes, for example, a processor, a RAM, a ROM, and the like, and performs a process such as conversion between a logical address and a physical address, bit error detection/correction, and wear leveling. The control die CD is connected to the plurality of memory dies MD, a host computer, and the like.

Memory Die MD

Figure 3:
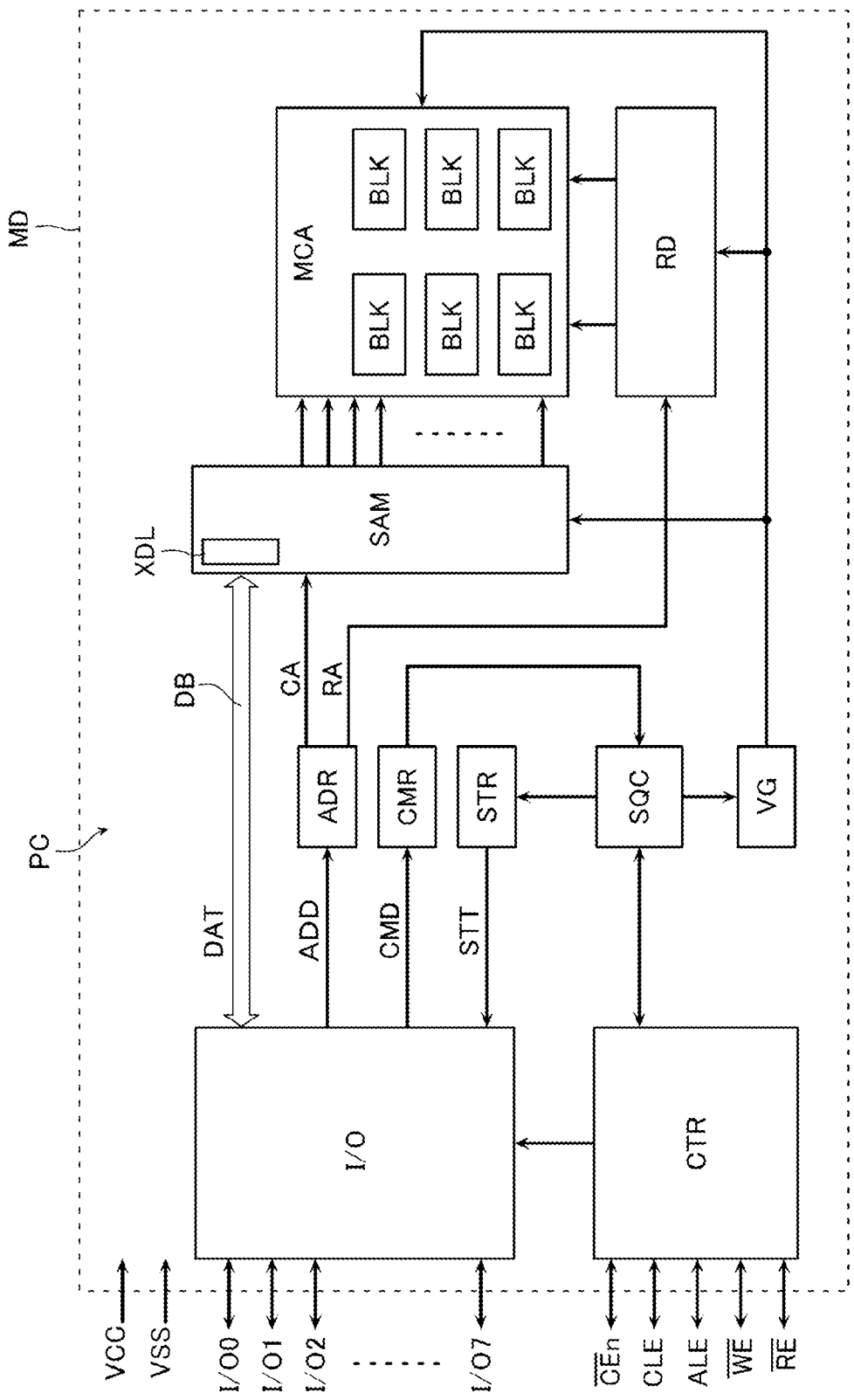
FIG. 3 is a schematic block diagram of the semiconductor storage device.
Figure 4:
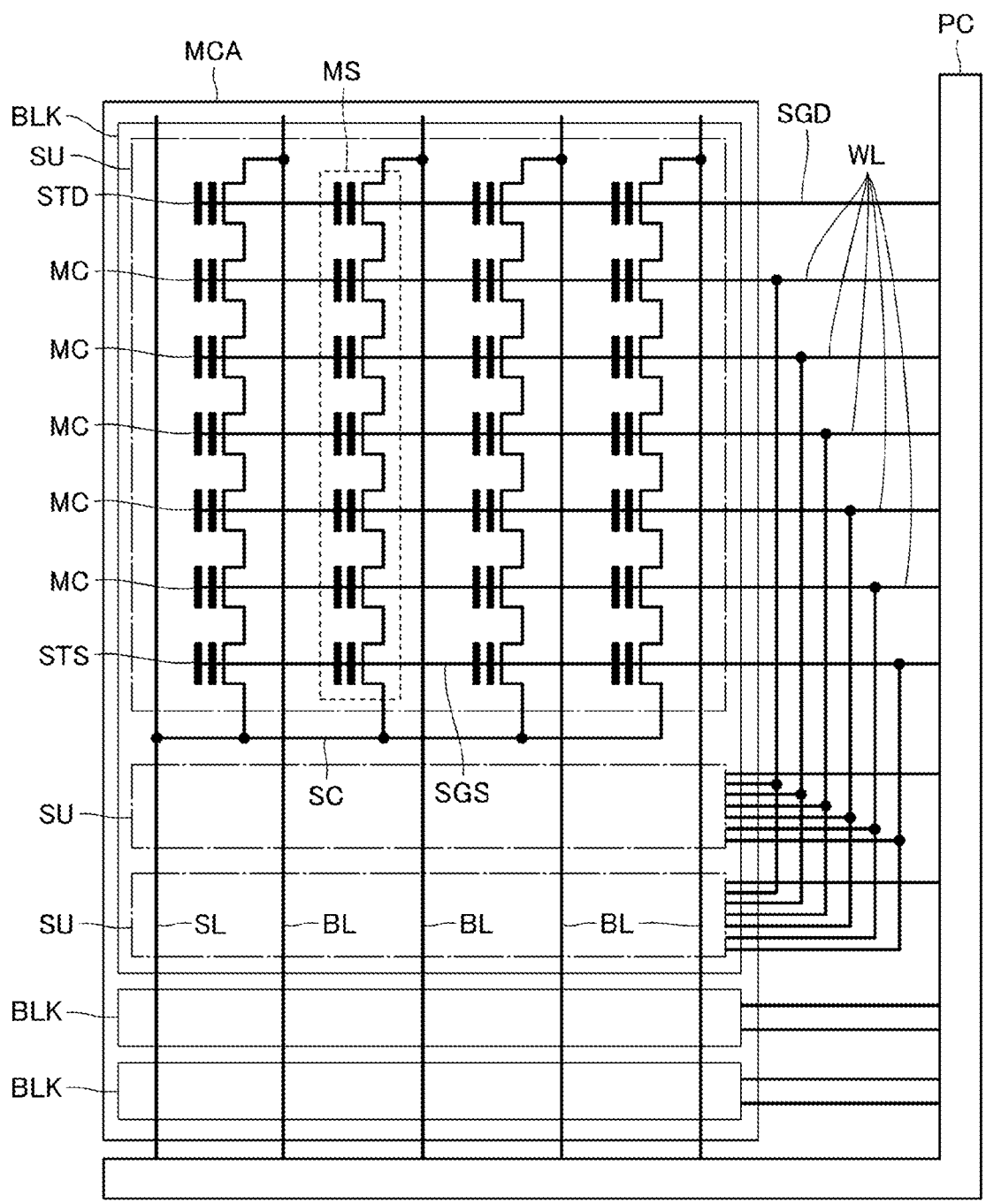
FIG. 4 is a schematic circuit diagram of the semiconductor storage device.

FIG. 3 is a schematic block diagram illustrating a configuration example of the semiconductor storage device according to the first embodiment. FIG. 4 is a schematic circuit diagram illustrating the configuration example of the semiconductor storage device according to the first embodiment.

As illustrated in FIG. 3, the memory die MD includes a memory cell array MCA for storing data, and a peripheral circuit PC connected to the memory cell array MCA.

Memory Cell Array MCA

The memory cell array MCA includes a plurality of memory blocks BLK as illustrated in FIG. 4. Each of the plurality of memory blocks BLK includes a plurality of string units SU. Each of the plurality of string units SU includes a plurality of memory strings MS. One ends of the plurality of memory strings MS are connected to the peripheral circuit PC via bit lines BL, respectively. The other ends of the plurality of memory strings MS are each connected to the peripheral circuit PC via a common wiring SC and a source line SL.

The memory string MS includes a drain select transistor STD, a plurality of memory cells MC, and a source select transistor STS connected in series between the bit line BL and the source line SL. Hereinafter, the drain select transistor STD and the source select transistor STS may be simply referred to as the select transistor (STD and STS).

The memory cell MC is a field-effect transistor including a semiconductor layer functioning as a channel region, a gate insulating film including a charge storage film, and a gate electrode. A threshold voltage of the memory cell MC changes according to an amount of charge stored in the charge storage film. The memory cell MC stores 1-bit or multi-bit data. Each of word lines WL is connected to each of the gate electrodes of the plurality of memory cells MC corresponding to one memory string MS. These word lines WL are commonly connected to all the memory strings MS in one memory block BLK.

The select transistors (STD and STS) are field-effect transistors including a semiconductor layer functioning as a channel region, a gate insulating film, and a gate electrode. Select gate lines (SGD and SGS) are connected to the gate electrodes of the select transistors (STD and STS), respectively. The drain selection lines SGD are provided in one-to-one correspondence with the string units SU, and are commonly connected to all the memory strings MS in one string unit SU. The source selection lines SGS are commonly connected to all the memory strings MS in one memory block BLK.

Peripheral Circuit PC

As illustrated in FIG. 3, the peripheral circuit PC includes a row decoder RD, a sense amplifier module SAM, a voltage generation circuit VG, and a sequencer SQC. The peripheral circuit PC includes an address register ADR, a command register CMR, and a status register STR. The peripheral circuit PC includes an input/output control circuit I/O and a logic circuit CTR.

The row decoder RD includes, for example, a decode circuit and a switch circuit. The decode circuit decodes a row address RA latched in the address register ADR. The switch circuit electrically connects the word line WL and the select gate lines (SGD and SGS) corresponding to the row address RA to a corresponding voltage supply line according to an output signal of the decode circuit.

The sense amplifier module SAM includes a plurality of sense amplifier circuits corresponding to a plurality of bit lines BL, a plurality of voltage adjustment circuits, and a plurality of data latches. The sense amplifier circuit causes the data latch to latch data of "H" or "L" indicating ON/OFF of the memory cell MC according to the current or voltage of the bit line BL. The voltage adjustment circuit electrically connects the bit line BL to the corresponding voltage supply line according to the data latched by the data latch.

The sense amplifier module SAM includes a decode circuit and a switch circuit (not illustrated). The decode circuit decodes a column address CA stored in the address register ADR. The switch circuit electrically connects the data latch corresponding to the column address CA to a bus DB according to the output signal of the decode circuit.

The voltage generation circuit VG includes, for example, a step-up circuit such as a charge pump circuit connected to power supply terminals VCC and VSS, a step-down circuit such as a regulator, and a plurality of voltage supply lines (not illustrated). In accordance with an internal control signal from the sequencer SQC, the voltage generation circuit VG generates a plurality of operation voltages to be applied to the bit line BL, the source line SL, the word line WL, and the select gate lines (SGD and SGS), in a read operation, write operation, and erase operation with respect to the memory cell array MCA and simultaneously output the plurality of operation voltages from the plurality of voltage supply lines. The power supply terminals VCC and VSS are assigned to, for example, a part of the plurality of external pad electrodes PX described with reference to FIGS. 1 and 2. The power supply terminal VCC is supplied with a power supply voltage VC, and the power supply terminal VSS is supplied with a ground voltage VS.

The sequencer SQC sequentially decodes command data CMD stored in the command register CMR, and outputs the internal control signal to the row decoder RD, the sense amplifier module SAM, and the voltage generation circuit VG. The sequencer SQC appropriately outputs a status data STT indicating its own state to the status register STR.

The input/output control circuit I/O includes data input/output terminals I/O0 to I/O7, shift registers connected to the data input/output terminals I/O0 to I/O7, and a buffer memory connected to the shift registers. The data input/output terminals I/O0 to I/O7 are assigned to, for example, a part of the plurality of external pad electrodes PX described with reference to FIGS. 1 and 2.

The buffer memory outputs data to a data latch XDL in the sense amplifier module SAM, the address register ADR, or the command register CMR according to an internal control signal from the logic circuit CTR. The buffer memory receives data from the data latch XDL or the status register STR according to the internal control signal from the logic circuit CTR. The buffer memory may be implemented by a part of the shift register, or may be implemented by another circuit such as an SRAM.

The logic circuit CTR receives an external control signal from the control die CD via external control terminals /CEn, CLE, ALE, /WE, and /RE, and in response to the external control signal, the logic circuit CTR outputs the internal control signal to the input/output control circuit I/O. The external control terminals /CEn, CLE, ALE, /WE, and /RE are assigned to, for example, a part of the plurality of external pad electrodes PX described with reference to FIGS. 1 and 2.

Figure 5:
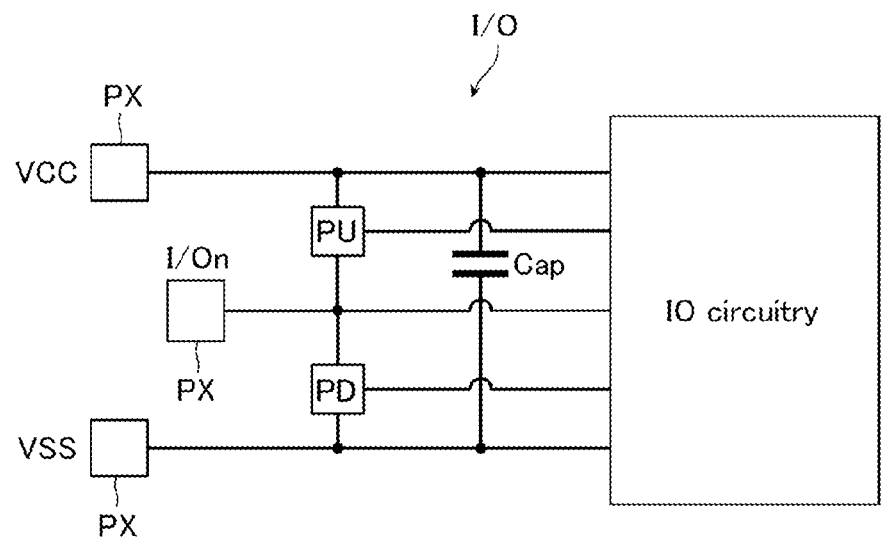
FIG. 5 is a schematic circuit diagram of an input/output circuit in the semiconductor storage device.

FIG. 5 is a schematic circuit diagram illustrating a configuration of a part of the input/output control circuit I/O. As described above, a part of the external pad electrodes PX functions as the power supply terminals VCC and VSS and the data input/output terminal I/On (n is a natural number of 0 to 7), respectively. The power supply terminals VCC and VSS are connected to various circuits in the input/output control circuit I/O, and supply power to these circuits.

The input/output control circuit I/O includes a data output control circuit for outputting a signal from the data input/output terminal I/On when outputting data, and a data input control circuit for receiving a signal from the data input/output terminal I/On when data is input thereto.

The data output control circuit includes a pull-up circuit PU connected between the power supply terminal VCC and the data input/output terminal I/On, and a pull-down circuit PD connected between the power supply terminal VSS and the data input/output terminal I/On. The pull-up circuit PU includes K (K is a natural number) PMOS transistors connected in parallel between the power supply terminal VCC and the data input/output terminal I/On. The gate electrodes of the plurality of PMOS transistors are respectively connected to K output terminals of a pull-up driver circuit in the IO circuitry of FIG. 5. The pull-down circuit PD includes L (L is a natural number) NMOS transistors connected in parallel between the power supply terminal VSS and the data input/output terminal I/On. The gate electrodes of the plurality of NMOS transistors are respectively connected to L output terminals of a pull-down driver circuit in the IO circuitry of FIG. 5. When outputting data, the pull-up circuit PU or the pull-down circuit PD is selectively driven according to the output data, and the data input/output terminal I/On is electrically connected to the power supply terminal VCC or the power supply terminal VSS. At this time, output impedance is controlled according to the number of PMOS transistors or NMOS transistors that are turned ON during driving.

The data input control circuit includes a comparator in the IO circuitry illustrated in FIG. 5. One input terminal of this comparator is connected to the data input/output terminal I/On, and the other input terminal is connected to a reference voltage supply line. When data is input, for example, when a voltage of the data input/output terminal I/On is higher than a reference voltage, "H" is output from the comparator. For example, when the voltage of the data input/output terminal I/On is higher than the reference voltage, "L" is output from the comparator.

A capacitive element Cap is connected between the power supply terminal VCC and the power supply terminal VSS. The capacitive element Cap functions, for example, as a so-called bypass capacitor that stabilizes a power supply voltage, which is a voltage between the power supply terminal VCC and the power supply terminal VSS, even during high-speed operation, as described later.

Configuration Example of Memory Die MD

Figure 6:
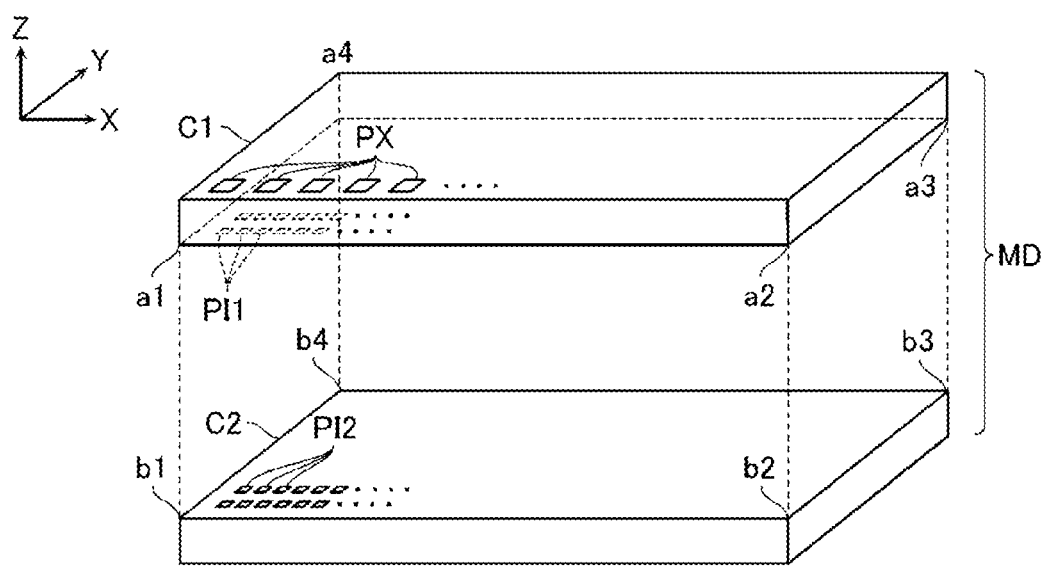
FIG. 6 is a schematic perspective view illustrating two chips that make up the semiconductor storage device.

FIG. 6 is a schematic perspective view illustrating a configuration example of the semiconductor storage device according to the first embodiment. As illustrated in FIG. 6, the memory die MD includes a first chip C1 and a second chip C2.

Hereinafter, regarding the first chip C1, a surface on which a plurality of first bonding electrodes PI1 are provided is referred to as a front surface, and a surface on which the plurality of external pad electrodes PX are provided is referred to as a rear surface. Regarding the second chip C2, a surface on which a plurality of second bonding electrodes PI2 are provided is referred to as a front surface, and a surface on a side opposite to the front surface is referred to as a rear surface. As illustrated in FIG. 6, the front surface of the second chip C2 is provided above the rear surface of the second chip C2, and the rear surface of the first chip C1 is provided above the front surface of the first chip C1.

The first chip C1 and the second chip C2 are arranged such that the front surface of the first chip C1 and the front surface of the second chip C2 face each other. The plurality of external pad electrodes PX are provided on the rear surface of the first chip C1, and a plurality of first bonding electrodes PI1 are provided on the front surface of the first chip C1. A plurality of second bonding electrodes PI2 are provided on the front surface of the second chip C2. The plurality of first bonding electrodes PI1 are provided in one-to-one correspondence with the plurality of second bonding electrodes PI2, and are disposed at positions where the plurality of first bonding electrodes PI1 can be bonded to the plurality of second bonding electrodes PI2, respectively. The first bonding electrode PI1 and the second bonding electrode PI2 function as bonding electrodes for bonding the first chip C1 and the second chip C2 and electrically connecting the first chip C1 to the second chip C2. The first bonding electrode PI1 and the second bonding electrode PI2 contain, for example, a conductive material such as copper (Cu).

In the example of FIG. 6, corners a1, a2, a3, and a4 of the first chip C1 correspond to corners b1, b2, b3, and b4 of the second chip C2, respectively.

Figure 7:
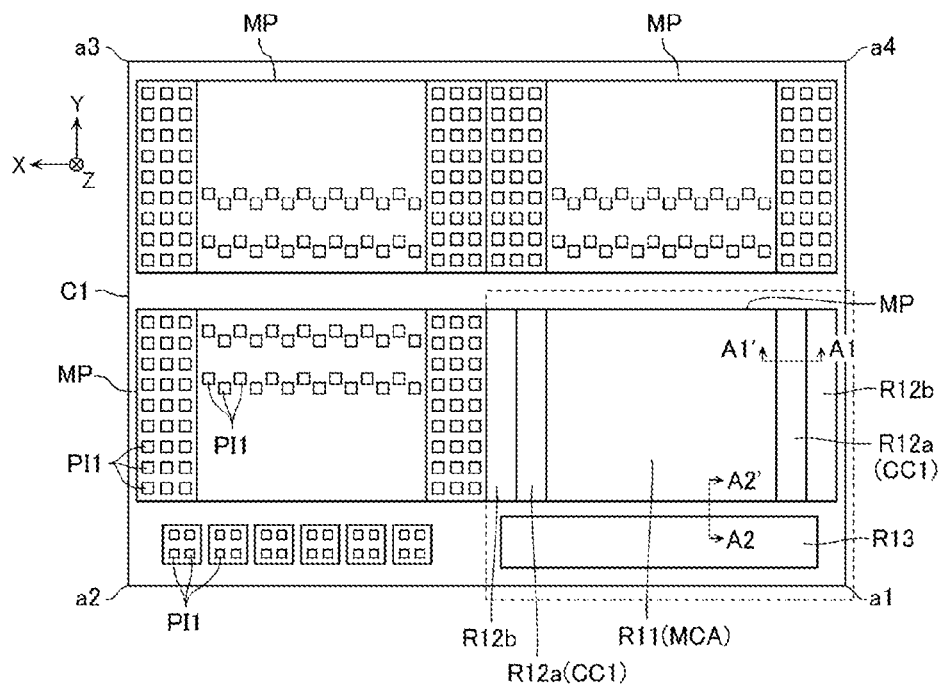
FIG. 7 is a schematic bottom view of one of the two chips of FIG. 6.
Figure 8:
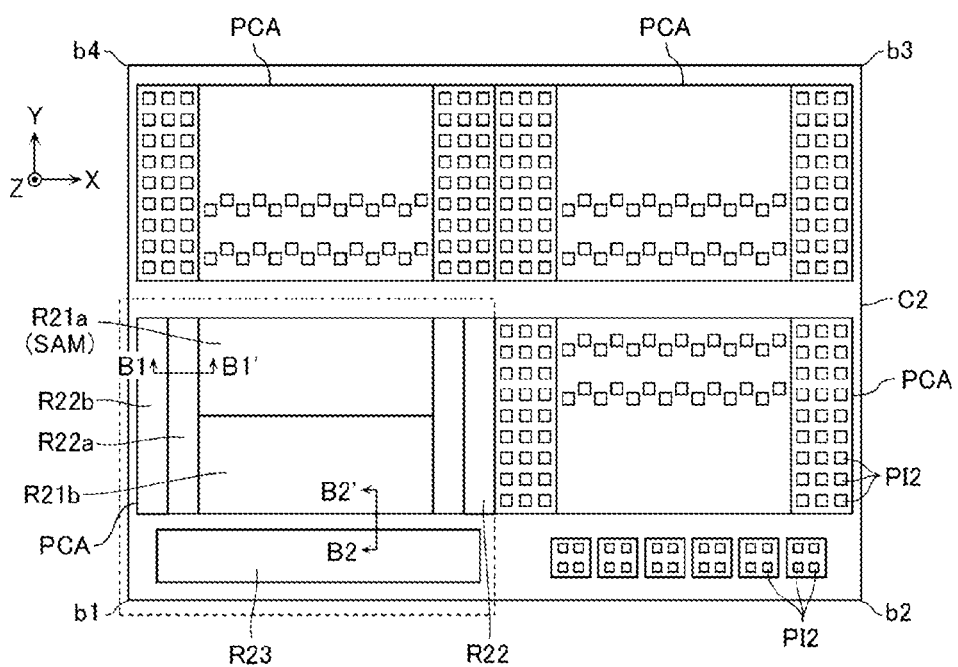
FIG. 8 is a schematic top view of the other of the two chips of FIG. 6.
Figure 9:
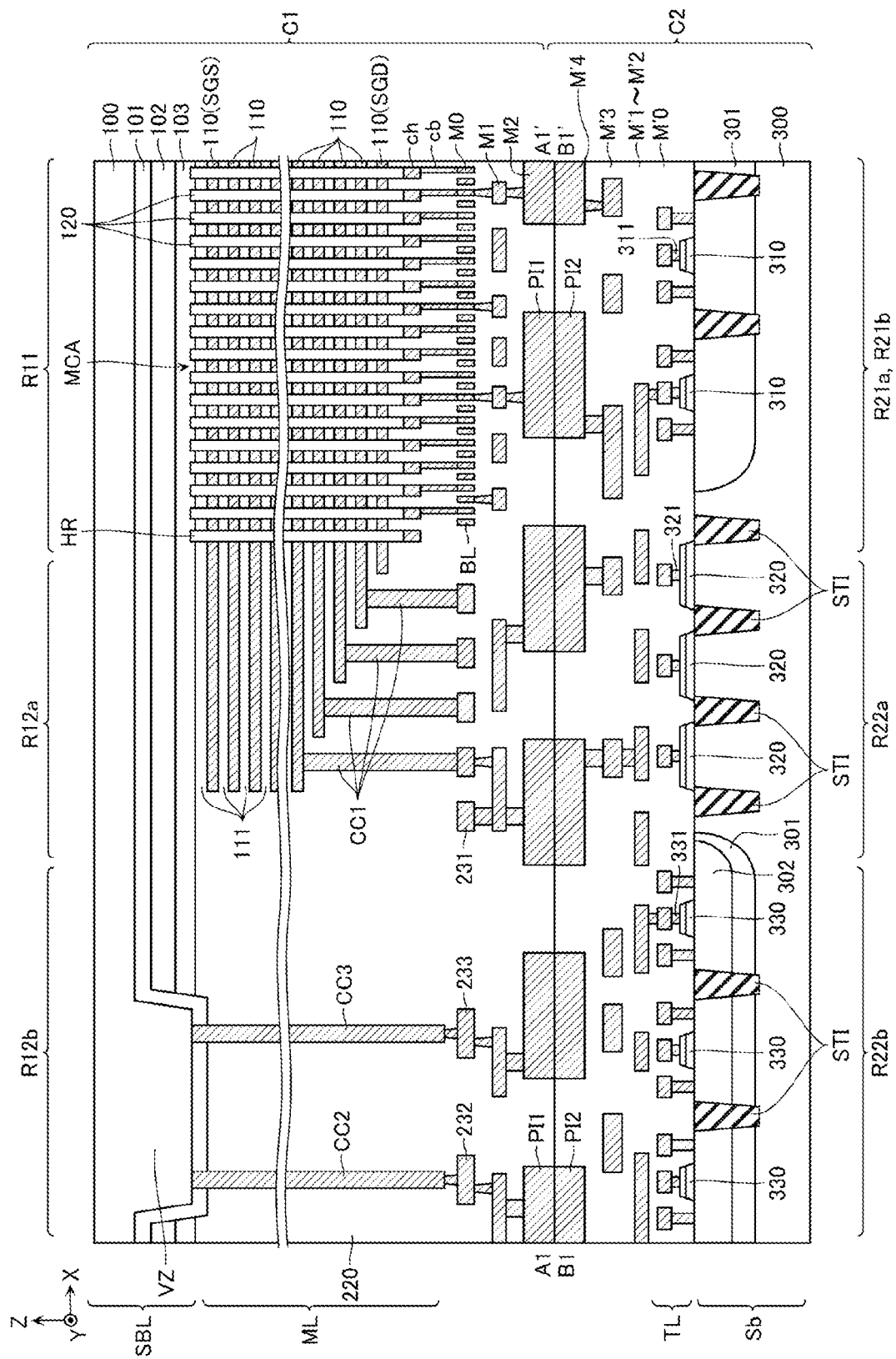
FIG. 9 is a schematic cross-sectional view corresponding to line A1-A1' of FIG. 7 and line B1-B1' of FIG. 8.
Figure 10A:
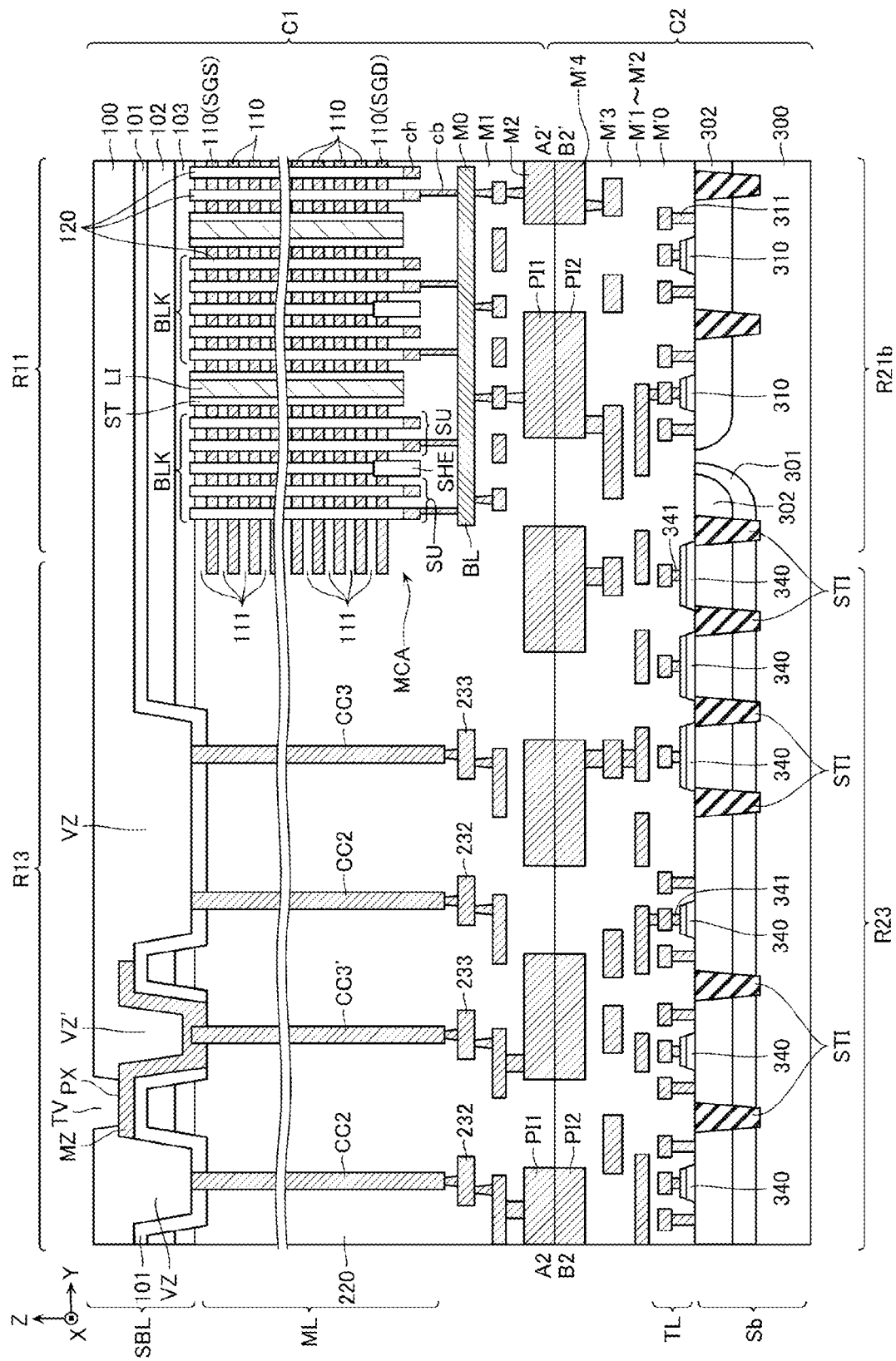
FIG. 10A is a schematic cross-sectional view corresponding to line A2-A2' of FIG. 7 and line B2-B2' of FIG. 8.

FIG. 7 is a schematic bottom view illustrating a configuration example of the first chip C1. A portion surrounded by a dotted line at the lower right of FIG. 7 illustrates a structure inside the front surface of the first chip C1 provided with the plurality of first bonding electrodes PI1. FIG. 8 is a schematic plan view illustrating a configuration example of the second chip C2. A portion surrounded by a dotted line at the lower left of FIG. 8 illustrates a structure inside the front surface of the second chip C2 provided with the plurality of second bonding electrodes PI2. FIG. 9 is a schematic sectional view corresponding to line A1-A1' of FIG. 7 and line B1-B1' of FIG. 8. FIG. 10A is a schematic sectional view corresponding to line A2-A2' of FIG. 7 and line B2-B2' of FIG. 8. FIGS. 9 and 10 illustrate cross-sections when structures illustrated in FIGS. 7 and 8 are cut along the lines and viewed in the directions of arrows, respectively.

FIGS. 7 to 10 illustrate schematic configurations, and the actual configuration can be appropriately changed. In FIGS. 7 to 10, a part of the configurations is omitted.

First Chip C1

As illustrated in FIG. 7, a first chip C1 includes four memory planes MP arranged in the X-direction and Y-direction. The memory plane MP includes a region R11 in which the memory cell array MCA is provided, a region R12a divided into two, and a region R12b divided into two. The region R12a is provided on one end side of the region R11 and also on the other end side of the region R11, in the X-direction. The region R12b is provided on one end side of the memory plane MP and also on the other end side of the memory plane MP, in the X-direction. The first chip C1 includes a region R13 provided in a region on one end side in the Y-direction with respect to the four memory planes MP.

As illustrated in FIGS. 9 and 10, the first chip C1 includes a base layer SBL, a memory layer ML provided below the base layer SBL, and a plurality of wiring layers M0, M1, and M2 provided below the memory layer ML.

The base layer SBL includes an insulating layer 100 provided on the rear surface of the first chip C1, an insulating layer 101 provided below the insulating layer 100, and an N-type well layer 102 provided below the insulating layer 101 and a P-type well layer 103 provided below the N-type well layer 102. The insulating layer 100 is, for example, a passivation layer made of an insulating material such as polyimide. The insulating layer 101 is, for example, an insulating layer made of an insulating material such as silicon oxide ($SiO_2$). The N-type well layer 102 is, for example, a semiconductor layer made of silicon (Si) containing N-type impurities such as phosphorus (P). The P-type well layer 103 is, for example, a semiconductor layer made of silicon (Si) containing P-type impurities such as boron (B). The P-type well layer 103 functions as the common wiring SC. The N-type well layer 102 and the P-type well layer 103 are divided for each memory plane MP (FIG. 7) via an insulating region VZ.

As illustrated in FIG. 10A, the base layer SBL includes a rear-surface wiring MZ provided in the region R13. The rear-surface wiring MZ is a wiring layer containing a conductive material such as aluminum (Al). The rear-surface wiring MZ is electrically insulated from the N-type well layer 102 and the P-type well layer 103 by the insulating layer 101. A part of the rear-surface wiring MZ is exposed to the outside of the memory die MD via an opening TV provided in the insulating layer 100, and functions as the external pad electrode PX.

The configuration of the base layer SBL illustrated in FIG. 9 and the like is merely an example, and the actual configuration and the like can be appropriately adjusted. For example, the base layer SBL may further include a P-type semiconductor region provided between the insulating layer 101 and the N-type well layer 102. For example, the base layer SBL may not include the N-type well layer 102.

In FIG. 9 and the like, a configuration in which the insulating region VZ is provided in a region that divides the memory plane MP is illustrated. However, the insulating region VZ may be provided in another region outside the memory plane MP.

As illustrated in FIG. 10A, the memory layer ML includes the memory cell array MCA provided in the region R11. The memory cell array MCA includes a plurality of memory blocks BLK arranged in the Y-direction. An inter-block insulating layer ST extending in the X-direction is provided between two memory blocks BLK adjacent in the Y-direction. Word lines WL in these two memory blocks BLK are electrically insulated via the inter-block insulating layer ST.

The memory block BLK includes two string units SU arranged in the Y-direction, and an inter-sub-block insulating layer SHE provided between the two string units SU.

The string unit SU includes a plurality of conductive layers 110 provided below the P-type well layer 103, a plurality of semiconductor pillars 120, and gate insulating films (not illustrated) provided respectively between the plurality of conductive layers 110 and the plurality of semiconductor pillars 120.

The conductive layers 110 are substantially plate-shaped conductive layers extending in the X-direction and the Y-direction, and are arranged in the Z-direction. Each conductive layer 110 may include, for example, a stacked film of titanium nitride (TiN) and tungsten (W), or may include polycrystalline silicon containing impurities such as phosphorus or boron. Further, an insulating layer 111 such as silicon oxide ($SiO_2$) is provided between the conductive layers 110.

Among the plurality of conductive layers 110, one or multiple conductive layers 110 located at the top of the plurality of conductive layers 110 functions as the source selection line SGS (FIG. 4) and a gate electrode of a plurality of source select transistors STS (FIG. 4) connected to the source selection line SGS. The plurality of middle conductive layers 110 located below the one or multiple conductive layers 110 located at the top function as the gate electrodes of the word line WL (FIG. 4) and the plurality of memory cells MC (FIG. 4) connected to the word line WL. One or multiple conductive layers 110 located below the plurality of middle conductive layers 110 functions as the drain selection line SGD (FIG. 4) and a gate electrode of a plurality of drain select transistors STD (FIG. 4) connected to the drain selection line SGD.

A plurality of semiconductor pillars 120 are provided side by side in the X-direction and the Y-direction. The semiconductor pillar 120 is, for example, a semiconductor film of undoped polycrystalline silicon (Si) or the like. The semiconductor pillar 120 has, for example, a substantially cylindrical shape, and is provided with an insulating film such as silicon oxide at its center. The outer peripheral surfaces of the semiconductor pillars 120 are surrounded by the conductive layers 110. Each of the semiconductor pillars 120 functions as a channel region of a plurality of memory cells MC and the drain select transistor STD in one memory string MS (FIG. 4). The upper end portions of the semiconductor pillars 120 are connected to the P-type well layer 103 via a semiconductor layer such as undoped monocrystalline silicon. The lower end portions of the semiconductor pillars 120 are connected to the bit lines BL via a semiconductor layer containing N-type impurities such as phosphorus (P), a contact ch, and a contact cb.

A gate insulating film (not illustrated) and a charge storage film (not illustrated) are provided between the semiconductor pillar 120 and the conductive layer 110. The charge storage film includes, for example, an insulating charge storage film such as silicon nitride (SiN) or a conductive charge storage film such as a floating gate.

A wiring LI is provided inside the inter-block insulating layer ST. The wiring LI may contain, for example, semiconductor containing N-type impurities such as phosphorus (P) or P-type impurities such as boron (B), may contain tungsten (W) or the like, or may contain silicide or the like. The wiring LI functions as the source line SL. The upper end portion of the wiring LI is connected to the P-type well layer 103. The lower end portion of the wiring LI is connected to a wiring in a wiring layer M1 via a contact, a wiring layer M0, and the like.

For example, as illustrated in FIG. 9, the memory layer ML includes a plurality of word line contacts CC1 provided in the region R12a. Each word line contact CC1 contains, for example, a conductive material such as tungsten (W). Each word line contact CC1 extends in the Z-direction. The upper end of each word line contact CC1 is connected to the end portion of the conductive layer 110 in the X-direction. The lower end of each word line contact CC1 is connected to each of wirings 231 in the wiring layer M0. Each of the wirings 231 is connected to each of the plurality of first bonding electrodes PI1 via a wiring in the wiring layer M1.

The memory layer ML includes an insulating layer 220 such as silicon oxide provided in the region R12b, and a plurality of penetrating electrodes CC2 and CC3 penetrating the insulating layer 220.

The plurality of penetrating electrodes CC2 and CC3 extend in the Z-direction through the insulating layer 220. The plurality of penetrating electrodes CC2 and CC3 contain a conductive material such as, for example, tungsten (W). The upper ends of the plurality of penetrating electrodes CC2 and CC3 are in contact with the insulating layer 100 provided in the insulating region VZ. The lower ends of the plurality of penetrating electrodes CC2 and CC3 are connected to the plurality of first bonding electrodes PI1 via wirings 232 and 233 in the wiring layer M0, respectively.

As described above, the insulating region VZ may be provided in a region other than the region that divides the memory plane MP. The plurality of penetrating electrodes CC2 and CC3 may be in contact with the insulating layer 100 in the insulating region VZ provided in such a region.

The plurality of penetrating electrodes CC2 and CC3 respectively function as one electrode and the other electrode of the capacitive element Cap described with reference to FIG. 5. That is, the plurality of penetrating electrodes CC2 respectively face the plurality of penetrating electrodes CC3. The penetrating electrodes CC2 and CC3 are connected to the power supply terminals VSS and VCC via the wirings 232 and 233, respectively. During operation of the semiconductor storage device, the ground voltage VS and the power supply voltage VC are supplied to the penetrating electrodes CC2 and CC3 via the power supply terminals VSS and VCC.

Figure 10B:
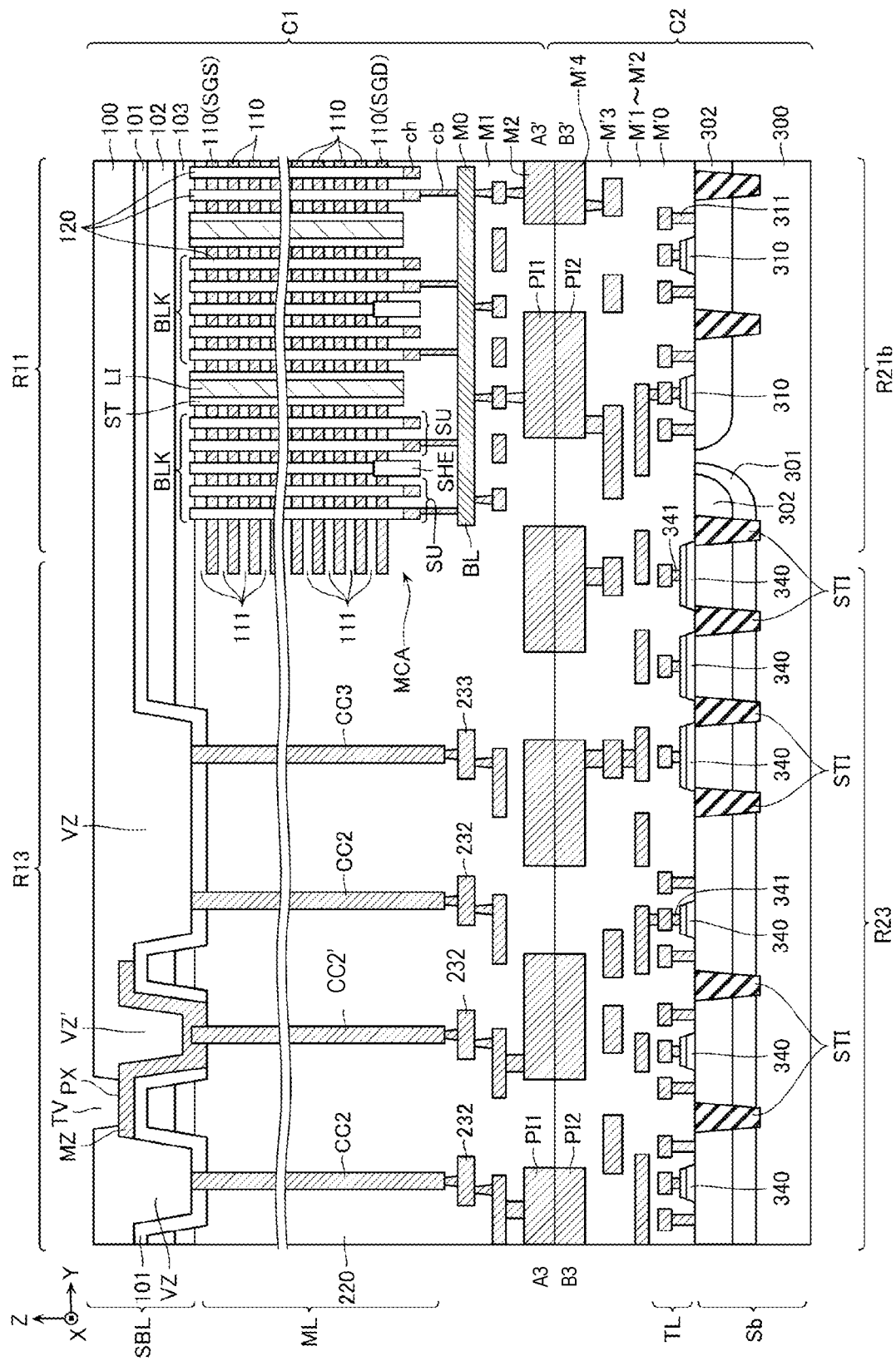
FIG. 10B is a schematic cross-sectional view shifted to x direction from FIG. 10A.

As illustrated in FIG. 10A, the memory layer ML includes a plurality of penetrating electrodes CC2, CC3, and CC3' provided in the region R13. As described above, the penetrating electrodes CC2 and CC3 function as a part of the capacitive element Cap. The penetrating electrode CC3' is configured substantially similarly to the penetrating electrode CC3. However, the upper end of the penetrating electrode CC3' is connected to the rear-surface wiring MZ provided in an insulating region VZ'. As described above, in FIG. 10A, the rear-surface wiring MZ formed on the penetrating electrode CC3' extends below the opening TV provided in the insulating layer 100, and function as the external pad electrode PX. One penetrating electrode CC3' is provided for one external pad electrode PX as shown in FIG. 10A; however, in alternative embodiments, a plurality of the penetrating electrode CC3' may be provided for one external pad electrode PX. The lower end of the penetrating electrode CC3' is connected to the wiring 233 in the wiring layer M0. The external pad electrode PX functions as the power supply terminal VCC, and is connected to the rear-surface wiring MZ, the penetrating electrode CC3', the wiring 233 and other wirings not shown in FIG. 10A. As illustrated in FIG. 10B, the memory layer ML also includes a penetrating electrode CC2' connected to another rear-surface wiring MZ', another external pad electrode PX functioning as the power supply terminal VSS, and the wiring 232. One or a plurality of the penetrating electrode CC2' may be provided for one external pad electrode PX. In FIG. 10A, the penetrating electrodes CC2, CC3 and CC3' are provided at almost equal interval. However, it would be preferable for the interval between the penetrating electrodes CC2 and CC3 functioning as a part of the capacitive element Cap to be narrower than the interval between the penetrating electrodes CC2 and CC3'. It is also acceptable that the interval between the penetrating electrodes CC2 and CC3 be narrower than the interval between the plurality of penetrating electrodes CC3'. The total number of the penetrating electrodes CC2 and CC3 per one capacitive element Cap is more than, for example two or more times, the number of the penetrating electrodes CC3' per one external pad electrode PX.

The wiring layer M0 is provided below the memory layer ML. The wiring layer M0 is, for example, a wiring layer containing a conductive material such as copper (Cu). The wiring layer M0 includes, for example, the bit line BL and the wirings 231 to 233. The wiring layer M1 is provided below the wiring layer M0. The wiring layer M1 is, for example, a wiring layer containing a conductive material such as copper (Cu) or aluminum (Al). A wiring layer M2 is provided below the wiring layer M1. The wiring layer M2 is, for example, a wiring layer containing a conductive material such as copper (Cu), and includes the plurality of first bonding electrodes PI1.

Second Chip C2

For example, as illustrated in FIG. 8, a second chip C2 includes four peripheral circuit regions PCA arranged in the X-direction and Y-direction corresponding to the memory planes MP. Each peripheral circuit region PCA includes a region R21a and a region R21b that are provided in a region facing the region R11 and arranged in the Y-direction, a region R22a provided in a region facing the region R12a, and a region R22b provided in a region facing the region R12b. The second chip C2 includes a region R23 provided in a region facing the region R13.

As illustrated in FIG. 9, the second chip C2 includes a semiconductor substrate Sb, a transistor layer TL provided above the semiconductor substrate Sb, and a plurality of wirings M'0, M'1, M'2, M'3, and M'4 provided above the transistor layer TL.

The semiconductor substrate Sb includes, for example, a P-type semiconductor region 300, a N-type well layer 301 provided above a part of the P-type semiconductor region 300, and a P-type well layer 302 provided above a part of the P-type semiconductor region 300 and the N-type well layer 301. The P-type semiconductor region 300 is, for example, a region of semiconductor such as monocrystalline silicon (Si) containing P-type impurities such as boron (B). The N-type well layer 301 is, for example, a semiconductor region containing N-type impurities such as phosphorus (P). The P-type well layer 302 is, for example, a semiconductor region containing P-type impurities such as boron (B). Further, an insulating region STI such as silicon oxide is provided on a part of the front surface of the semiconductor substrate Sb.

The transistor layer TL includes a plurality of transistors 310 provided in the regions R21a and R21b, and a plurality of contacts 311 connected to the plurality of transistors 310. Among the plurality of transistors 310 and the contacts 311, those transistors 310 and contacts 311 provided in the region R21a make up parts of the sense amplifier module SAM described with reference to FIG. 3 and the like. At least a part of the plurality of transistors 310 is connected to the bit lines BL via, for example, the second bonding electrodes PI2 provided in the region R21a and the first bonding electrodes PI1 provided in the region R11. Among the plurality of transistors 310 and contacts 311, those transistors 310 and contacts 311 provided in the region R21b make up parts of the peripheral circuit PC.

In FIG. 9, as the transistor 310, a PMOS transistor having the N-type well layer 301 as a channel region is illustrated. In FIG. 10A, as the transistor 310, an NMOS transistor having the P-type well layer 302 provided in the P-type semiconductor region 300 as a channel region is illustrated. However, although not illustrated, the regions R21a and R21b may include, for example, NMOS-type high breakdown voltage transistors having the P-type semiconductor region 300 as a channel region. The high breakdown voltage transistor has a larger gate length and a larger gate width than a part of the transistors in the transistor layer TL. Further, the high breakdown voltage transistor has a larger gate insulating film thickness than a part of the transistors in the transistor layer TL.

As illustrated in FIG. 9, the transistor layer TL includes a plurality of transistors 320 provided in the region R22a, and a plurality of contacts 321 connected to the plurality of transistors 320. The plurality of transistors 320 and contacts 321 make up parts of a switch circuit in the row decoder RD described with reference to FIG. 3 and the like. The plurality of transistors 320 are connected to the plurality of conductive layers 110 via, for example, the second bonding electrodes PI2 provided in the region R22a and the first bonding electrodes PI1 provided in the region R12a.

In FIG. 9, as the transistor 320, an NMOS-type high breakdown voltage transistor having the P-type semiconductor region 300 as a channel region is illustrated. However, although not illustrated, the region R22a may include, for example, an NMOS transistor having the P-type well layer 302, which is provided in the P-type semiconductor region 300 via the N-type well layer 301, as a channel region.

The transistor layer TL includes a plurality of transistors 330 provided in the region R22b and a plurality of contacts 331 connected to the plurality of transistors 330. The plurality of transistors 330 and contacts 331 make up parts of a decode circuit in the row decoder RD described with reference to FIG. 3 and the like. The decode circuit in the row decoder RD may be provided in, for example, the regions R21a and R21b or another region. In such a case, a transistor of a circuit other than the decode circuit may be provided in the region R22b.

In FIG. 9, as the transistor 330, an NMOS transistor having the P-type well layer 302, which is provided in the P-type semiconductor region 300 via the N-type well layer 301, as a channel region is illustrated. However, such a configuration is merely an example, and can be appropriately adjusted. For example, the transistor 330 may be an NMOS transistor having the P-type semiconductor region 300 as a channel region, or a PMOS transistor having the N-type well layer 301 as a channel region.

As illustrated in FIG. 10A, the transistor layer TL includes a plurality of transistors 340 provided in the region R23 and a plurality of contacts 341 connected to the plurality of transistors 340. The plurality of transistors 340 and contacts 341 make up parts of the peripheral circuit PC described with reference to FIG. 3 and the like.

In FIG. 10A, as the transistor 340, an NMOS transistor having the P-type well layer 302, which is provided in the P-type semiconductor region 300 via the N-type well layer 301, as a channel region is illustrated. However, such a configuration is merely an example, and can be appropriately adjusted. For example, the transistor 340 may be an NMOS transistor having the P-type semiconductor region 300 as a channel region, or a PMOS transistor having the N-type well layer 301 as a channel region.

The length of the penetrating electrodes CC2, CC3, and CC3' in the first chip C1 in the Z-direction is longer than the length of the contacts 311, 321, 331, and 341 in the second chip C2 in the Z-direction.

The wiring layer M'0 is provided above the transistor layer TL. The wiring layer M'0 is, for example, a wiring layer containing a conductive material such as tungsten (W). The wiring layer M'1 is provided above the wiring layer M'0. The wiring layer M'1 is, for example, a wiring layer containing a conductive material such as copper (Cu). Although not illustrated in FIGS. 9 and 10, the wiring layer M'2 is provided above the wiring layer M'1. The wiring layer M'2 is, for example, a wiring layer containing a conductive material such as copper (Cu). The wiring layer M'3 is, for example, a wiring layer containing a conductive material such as copper (Cu) or aluminum (Al). The wiring layer M'4 is, for example, a wiring layer containing a conductive material such as copper (Cu) and includes the plurality of second bonding electrodes PI2.

Manufacturing Method

Next, a manufacturing method of the semiconductor storage device according to the first embodiment will be described with reference to FIGS. 11 to 17. FIGS. 11 to 17 are schematic cross-sectional views illustrating the manufacturing method of the semiconductor storage device according to the first embodiment. FIGS. 11 to 17 illustrate cross sections corresponding to a part of the region R13 and the region R23 in FIG. 10A.

Figure 11:
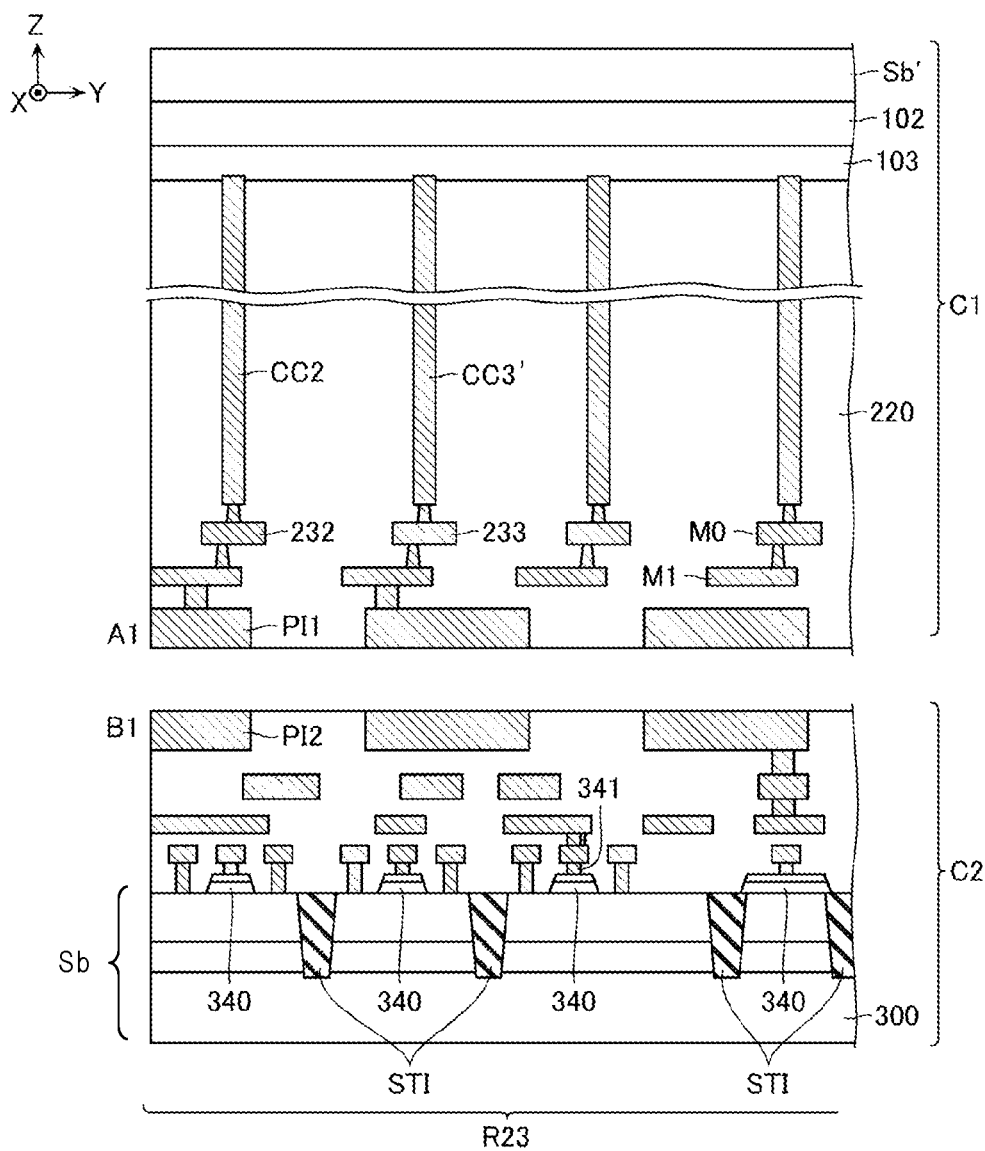
FIGS. 11-17 are each a schematic cross-sectional view illustrating a manufacturing method of the semiconductor storage device.

As illustrated in FIG. 11, in the same manufacturing method, a circuit configuration provided on the first chip C1 is formed on a substrate Sb'. A circuit configuration provided on the second chip C2 is formed on the semiconductor substrate Sb. Further, the substrate Sb' and the semiconductor substrate Sb are arranged such that the front surface side of the first chip C1 and the front surface side of the second chip C2 face each other.

Figure 12:
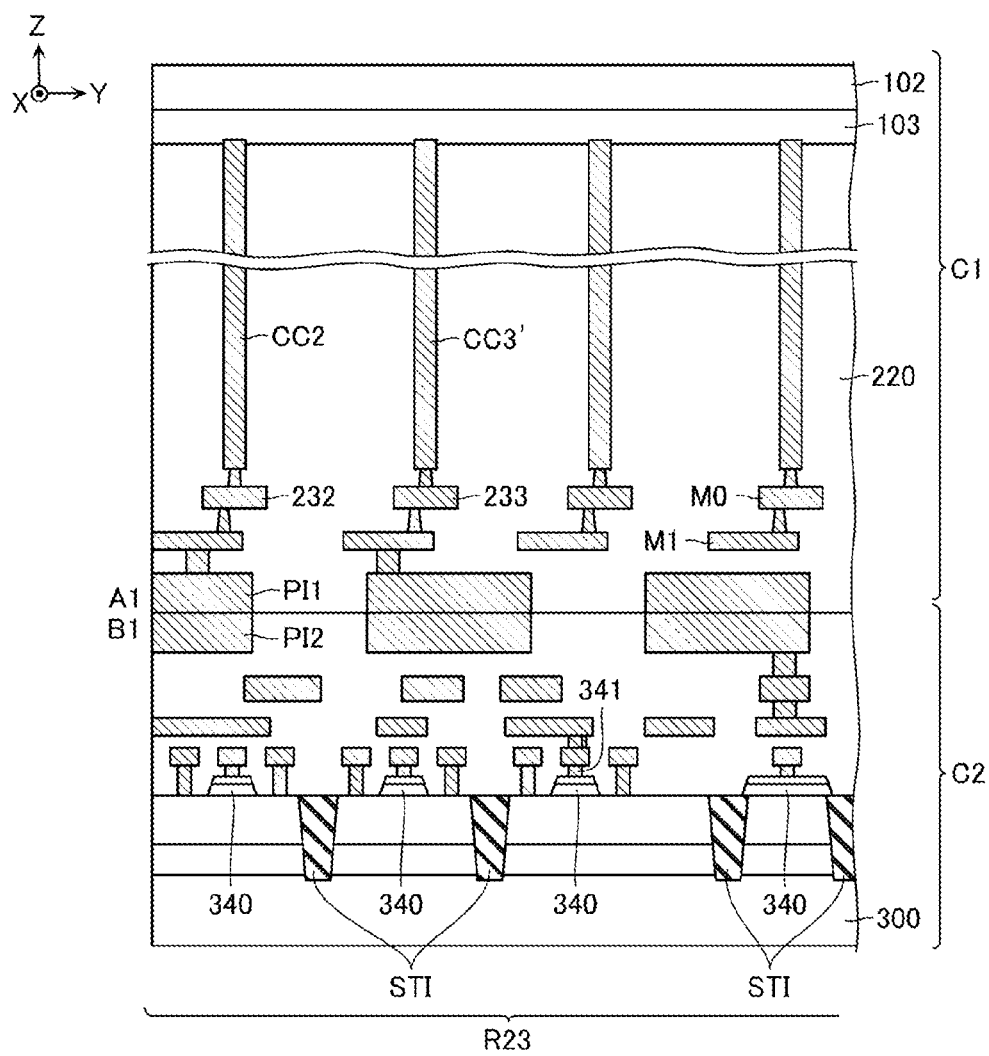

Next, as illustrated in FIG. 12, the first bonding electrode PI1 and the second bonding electrode PI2 are joined, and the circuit configurations of the first and second bonding electrodes PI1 and PI2 are bonded. This bonding step is performed by, for example, a direct joining method for a bonding electrode.

Next, as illustrated in FIG. 12, the substrate Sb' is removed. In this step, the substrate Sb' may be completely removed, or a part of the substrate Sb' may be left. This step is performed by, for example, grinding, chemical mechanical polishing (CMP), or a method using both the grinding and the CMP.

Figure 13:
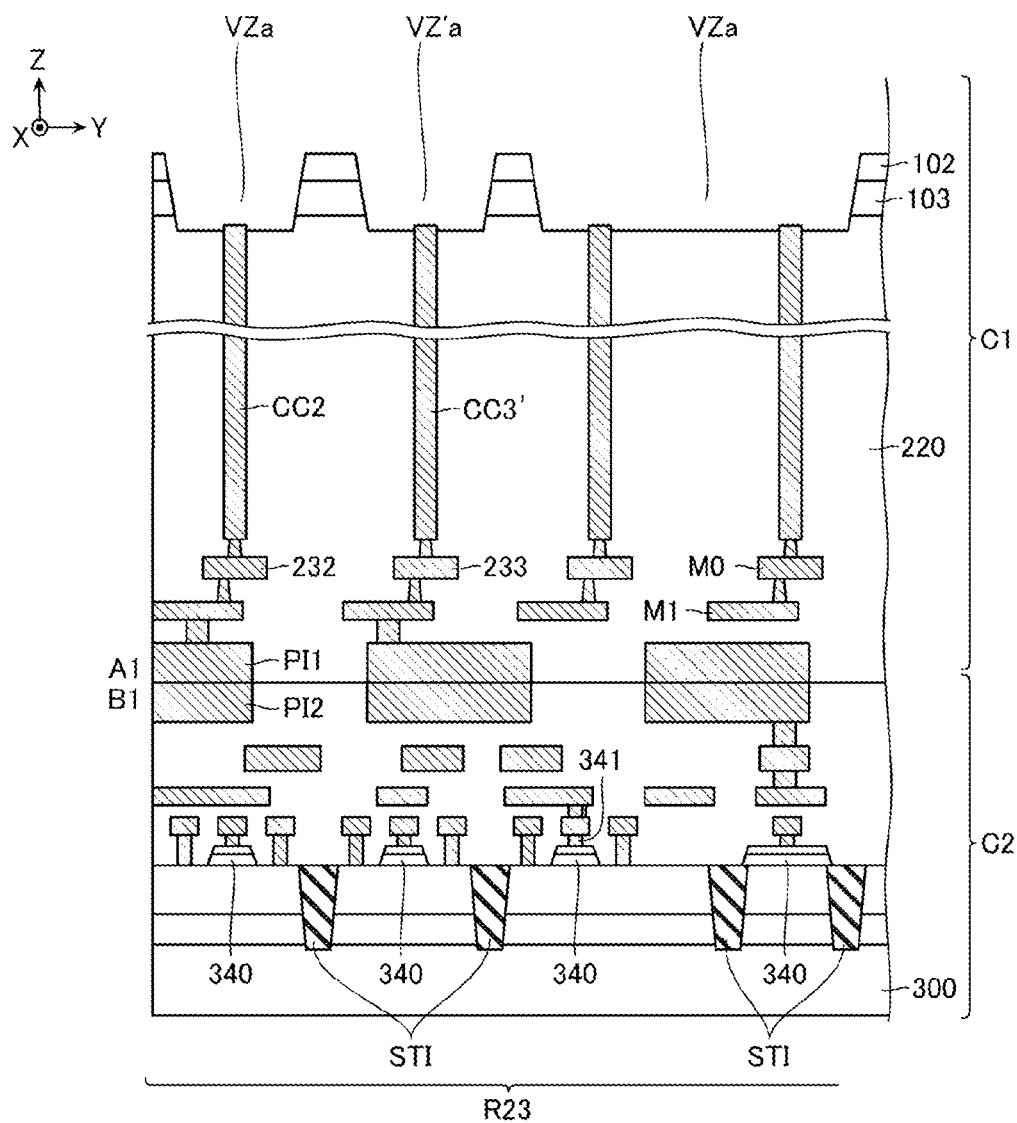

Next, as illustrated in FIG. 13, a plurality of openings VZa and VZ'a are formed on the upper surface of the configuration illustrated in FIG. 12. The openings VZa and VZ'a penetrate through the N-type well layer 102 and the P-type well layer 103 to respectively expose the upper ends of the penetrating electrodes CC2 and CC3. One opening VZa and one opening VZ'a may respectively correspond to one penetrating electrode CC2 and one penetrating electrode CC3, or may respectively correspond to a plurality of penetrating electrodes CC2 and a plurality of penetrating electrodes CC3. This step is performed by, for example, reactive ion etching (RIE).

Figure 14:
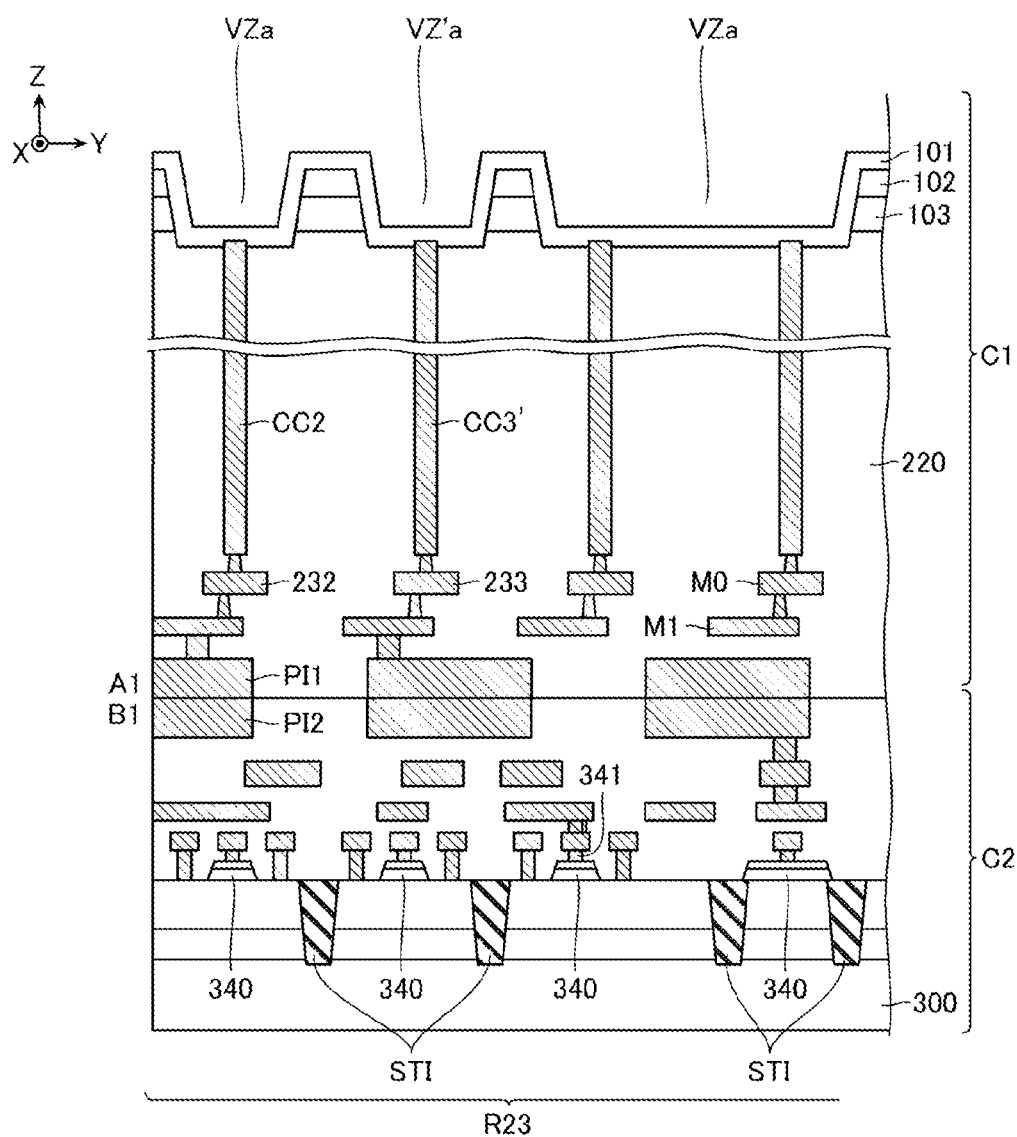

Next, as illustrated in FIG. 14, the insulating layer 101 of silicon oxide or the like is formed on the bottom surfaces and the inner peripheral surfaces of the plurality of openings VZa and VZ'a, and the upper surface of the structure illustrated in FIG. 13. This step is performed by, for example, chemical vapor deposition (CVD).

Figure 15:
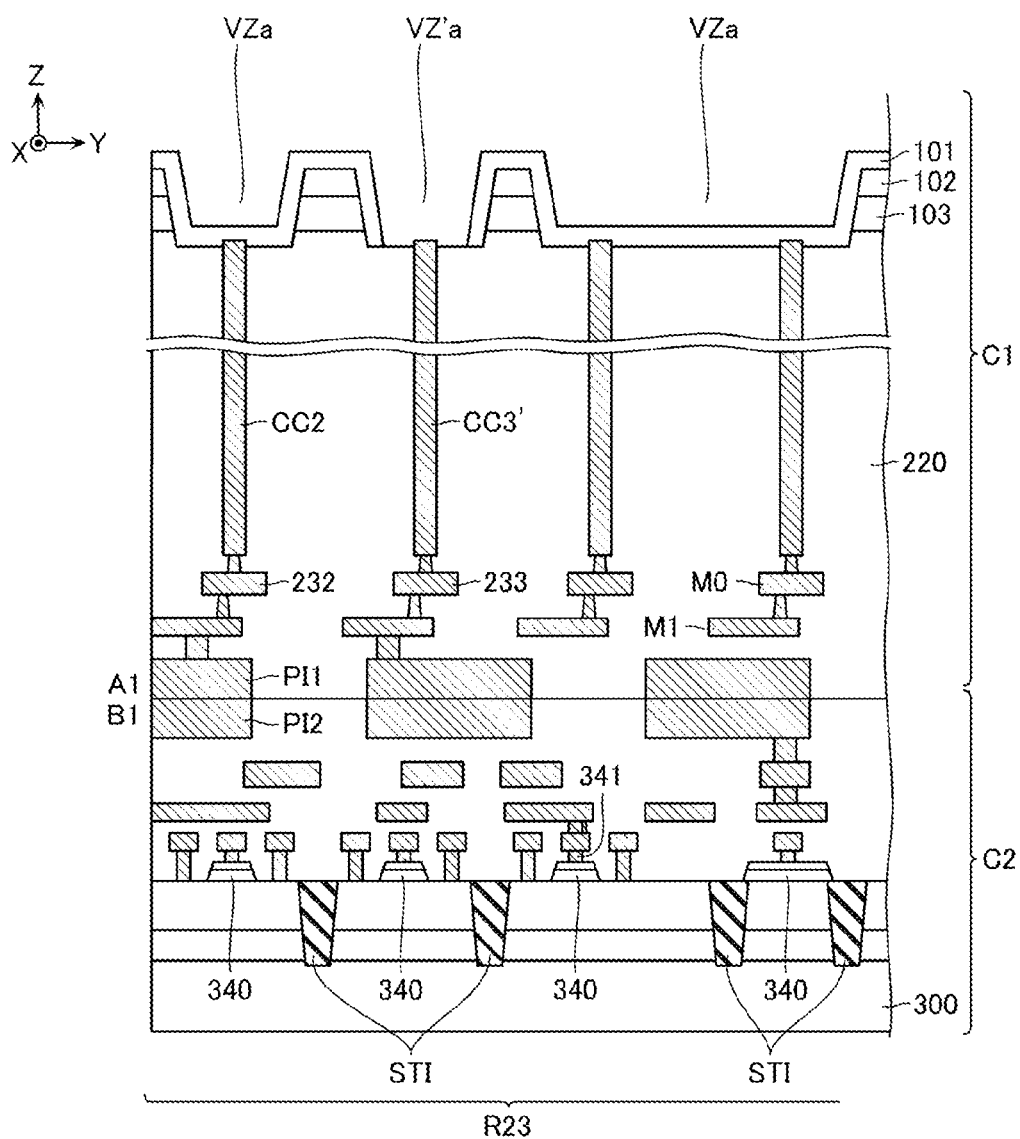

Next, as illustrated in FIG. 15, the insulating layer 101 on the bottom surfaces of the plurality of openings VZ'a is removed to expose lower end portions of the plurality of penetrating electrodes CC3. In this step, the bottom surfaces of the plurality of openings VZa are not exposed. This step is performed by, for example, a method such as etch back by RIE.

Figure 16:
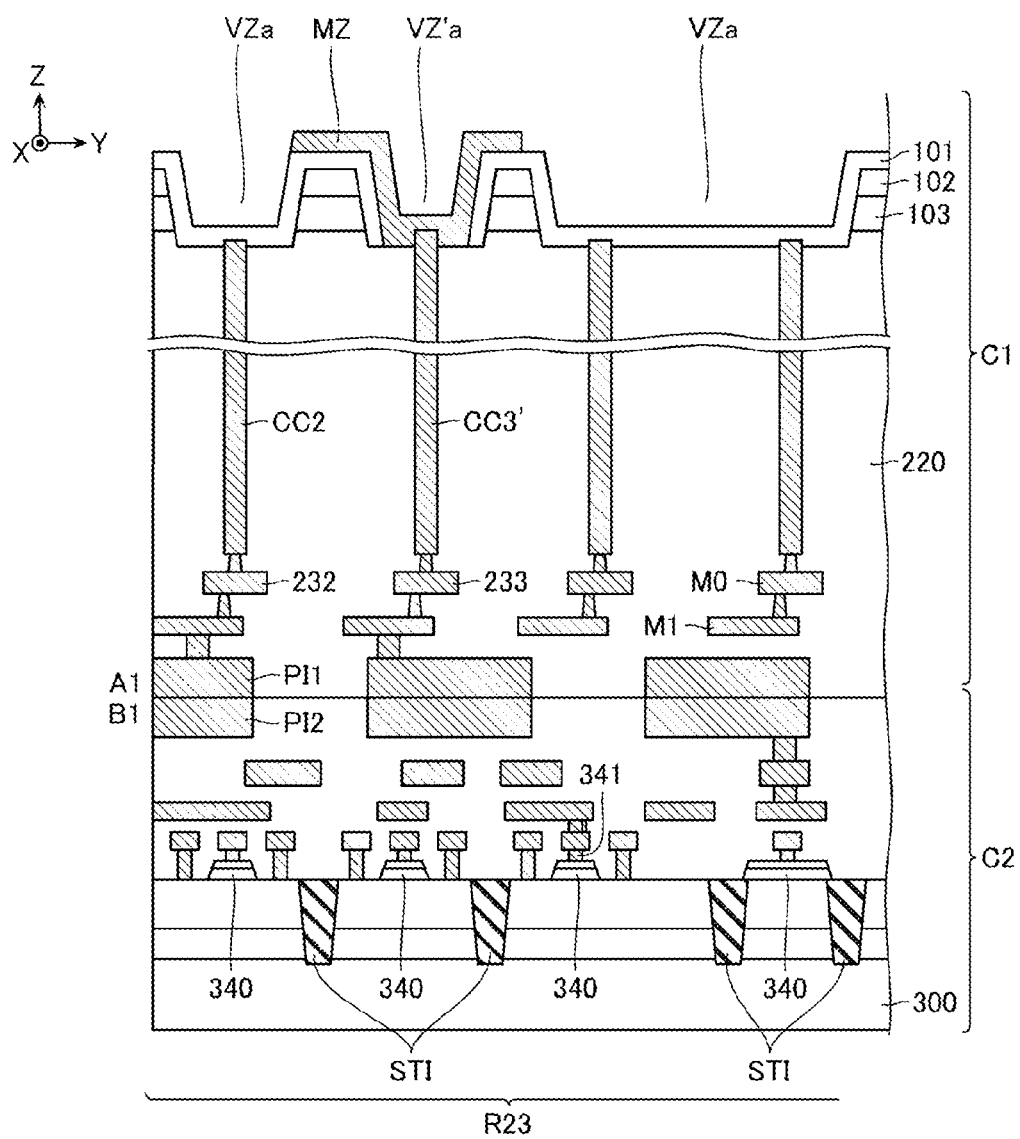

Next, as illustrated in FIG. 16, the rear-surface wiring MZ is formed on the bottom surfaces and the inner peripheral surfaces of the plurality of openings VZ'a, and peripheral portions of the openings VZ'a. This step is performed by, for example, film formation by CVD followed by etching or the like.

Figure 17:
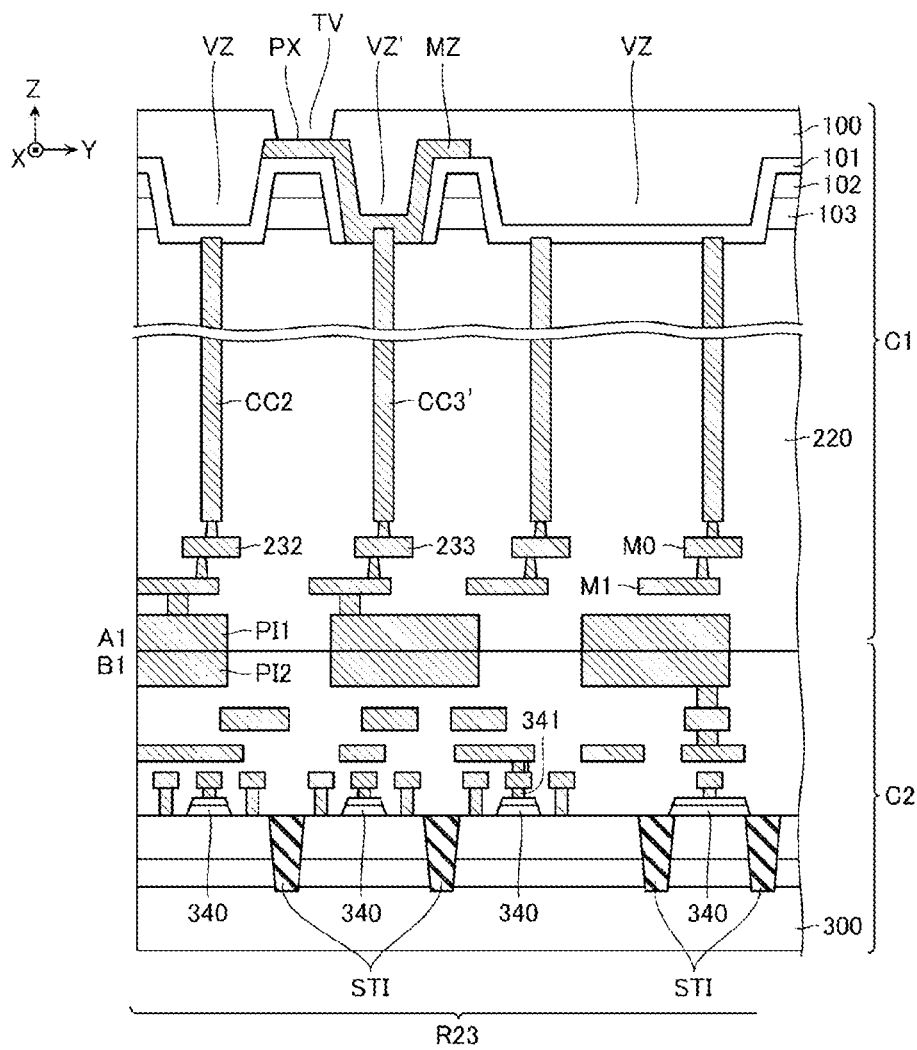

Next, as illustrated in FIG. 17, the insulating layer 100 is formed on the upper surface of the structure illustrated in FIG. 16, and the opening TV is formed in the insulating layer 100. This step is performed by a method such as CVD and RIE.

Thereafter, the configuration illustrated in FIG. 17 is singulated by dicing or the like. With this configuration, the semiconductor storage device described with reference to FIGS. 6 to 10 is manufactured.

Effect

With the increase in an interface speed of the semiconductor storage device, fluctuations in the voltages of the power supply terminals VCC and VSS are increasing. In such a case, power cannot be stably supplied to each circuit configuration of the semiconductor storage device, and the semiconductor storage device may not be able to operate stably. In order to prevent this, for example, it is conceivable to increase capacitance of a bypass capacitor connected to the power supply terminals VCC and VSS.

Therefore, in the semiconductor storage device according to the first embodiment, a bypass capacitor is formed using the penetrating electrodes CC2 and CC3 provided in the memory layer ML of the first chip C1.

Here, since the memory cell array MCA is provided in the memory layer ML of the first chip C1, the length in the Z-direction of the memory layer ML is relatively long. Accordingly, the length in the Z-direction of the penetrating electrodes CC2 and CC3 provided in the memory layer ML is also relatively long. Accordingly, by forming a bypass capacitor using such relatively long penetrating electrodes CC2 and CC3, it is possible to form a bypass capacitor having large capacitance. With this configuration, it is possible to increase the interface speed of the semiconductor storage device without destabilizing the operation of the semiconductor storage device.

In order to form a capacitor, for example, a wiring in a wiring layer or a channel region and a gate electrode of a transistor in the transistor layer TL may be used. However, when attempting to increase capacitance of the capacitor having such a configuration, it is necessary to reduce an area of the wiring in the wiring layer or an area of the transistor in the transistor layer TL.

Here, in the first embodiment, the plurality of penetrating electrodes CC2 and CC3 are formed in a region other than the region where the memory cell array MCA and the like are provided in the memory layer ML of the first chip C1, and the capacitive element Cap is formed using the penetrating electrodes CC2 and CC3. According to such a configuration, it is not necessary to reduce the area of the wiring or the transistor.

The penetrating electrodes CC2 and CC3 that make up the capacitive element Cap can be formed collectively when forming the penetrating electrode CC3' connecting the external pad electrode PX and the wiring 233 in the wiring layer M0. Accordingly, it is possible to implement the semiconductor storage device without increasing the manufacturing cost.

Configuration Example of Penetrating Electrodes CC2 and CC3

Figure 18:
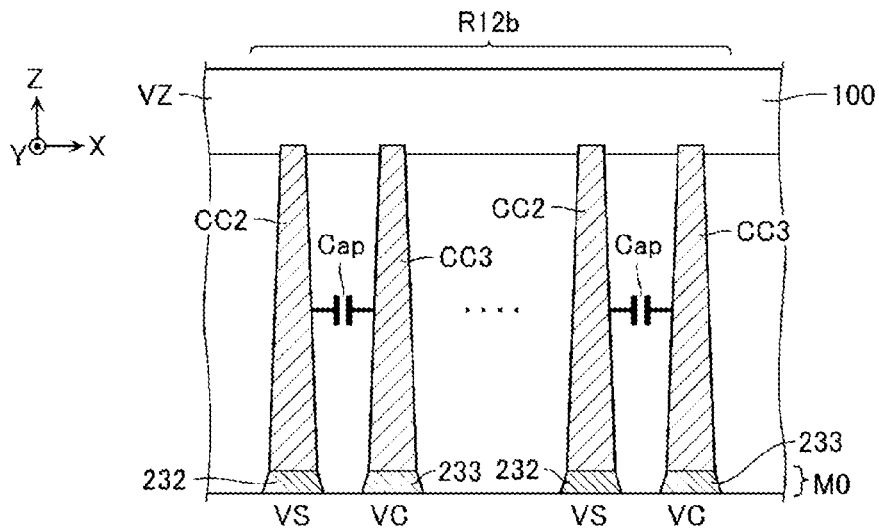
FIG. 18 is a schematic cross-sectional view illustrating a first configuration example of a capacitive element formed in the semiconductor storage device.

In the example described above, the upper ends of the penetrating electrodes CC2 and CC3 are in contact with the insulating layer 100 as illustrated in FIG. 18. However, such a configuration is merely an example, and can be appropriately adjusted.

Figure 19:
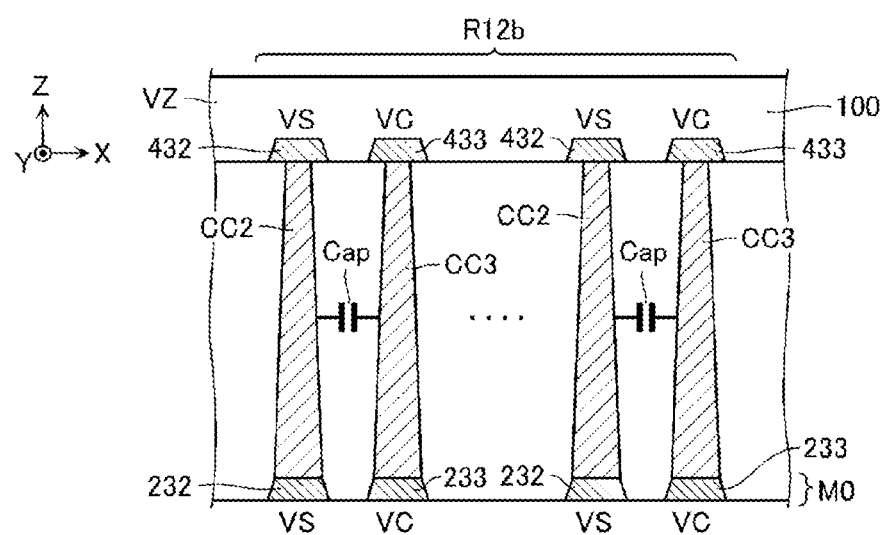
FIG. 19 is a schematic cross-sectional view illustrating a second configuration example of the capacitive element formed in the semiconductor storage device.

For example, as illustrated in FIG. 19, the upper ends of the penetrating electrodes CC2 and CC3 may be connected to wirings 432 and 433. The wirings 432 and 433 may be formed, for example, simultaneously with the rear-surface wiring MZ. According to such a configuration, for example, even when one of the wirings 232 and 432 is disconnected, the capacitive element Cap can be implemented by the other wiring of the wirings 232 and 432. Also, even when one of the wirings 233 and 433 is disconnected, the capacitive element Cap can be implemented by the other wiring of the wirings 233 and 433. Accordingly, the capacitive element Cap can be operated stably.

Figure 20:
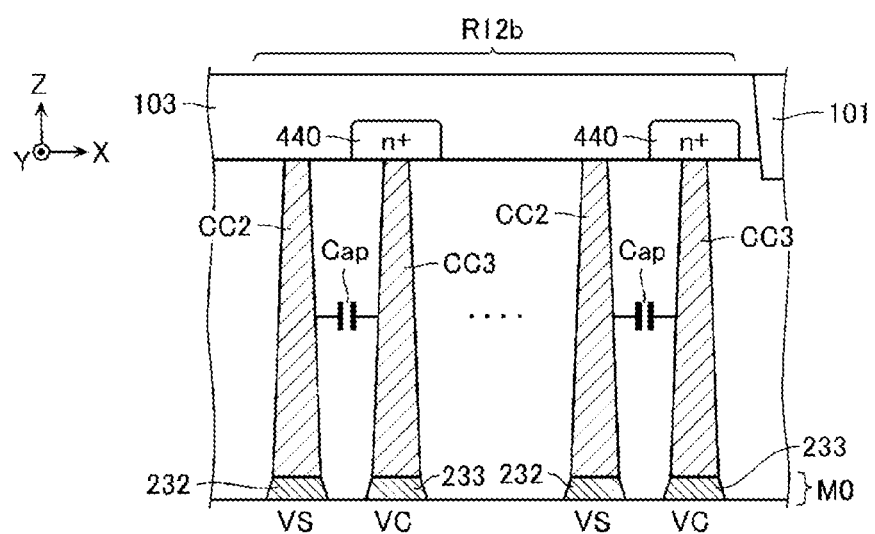
FIG. 20 is a schematic cross-sectional view illustrating a third configuration example of the capacitive element formed in the semiconductor storage device.

Also, for example, as illustrated in FIG. 20, an n+ region 440 in which n-type impurities such as phosphorus (P) are implanted may be provided in the P-type well layer 103 of the first chip C1, the upper end of the penetrating electrode CC2 may be connected to the P-type well layer 103, and the upper end of the penetrating electrode CC3 may be connected to the n+region 440. According to such a configuration, the capacitive element Cap has parasitic capacitance between the P-type well layer 103 and the n+ region 440, in addition to the capacitance between the penetrating electrodes CC2 and CC3. Accordingly, a larger capacitance value can be obtained as compared with the capacitive element Cap including only the penetrating electrodes CC2 and CC3.

Configuration Examples of Wirings 232, 233, 432, and 433

Figure 21A:
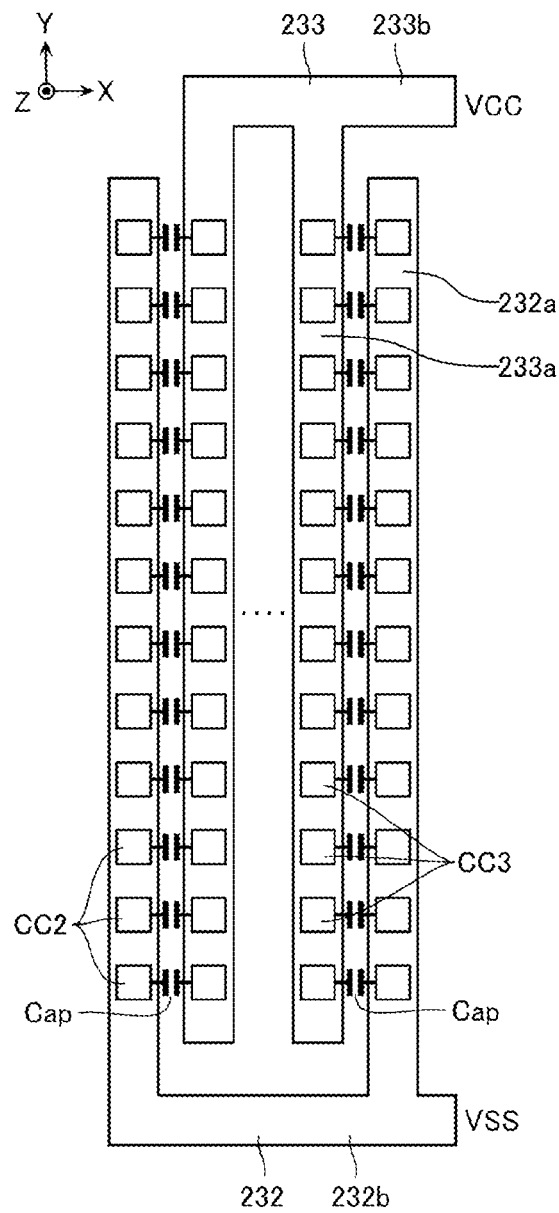
FIGS. 21A and 21B are schematic views illustrating an example of wirings connected to the capacitive element formed in the semiconductor storage device.
Figure 21B:
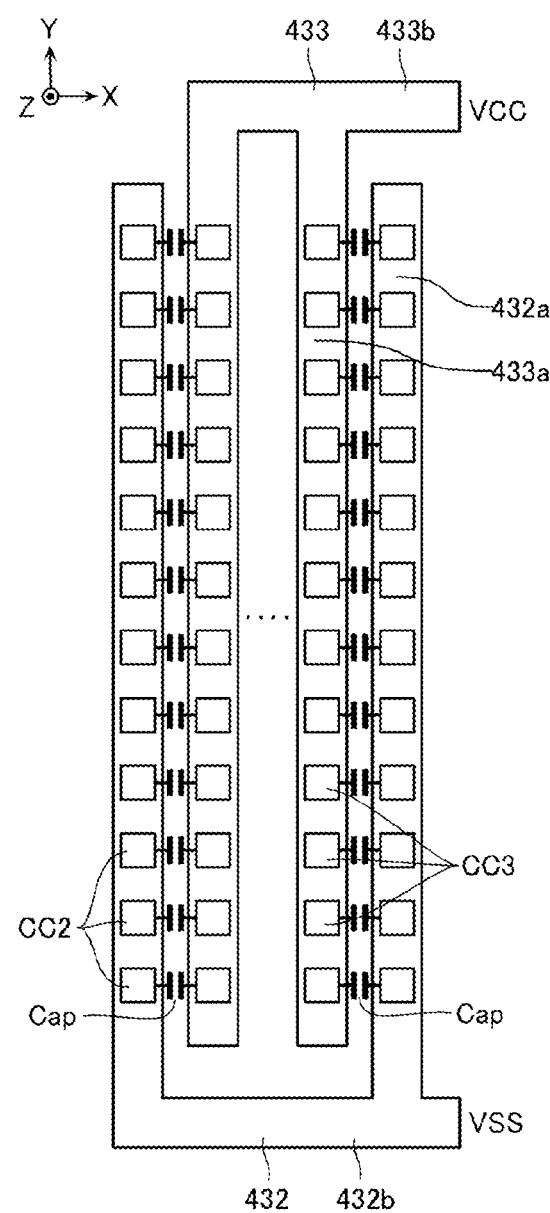

FIGS. 21A and 21B are schematic XY cross-sectional views illustrating one configuration example of the wirings 232, 233, 432, and 433. FIG. 21A illustrates the configurations of the wirings 232 and 233. FIG. 21B illustrates the configurations of the wirings 432 and 433.

In the example of FIG. 21A, the wirings 232 and 233 are formed in a comb shape. That is, in the example of FIG. 21A, a plurality of electrodes 232a extending in the Y-direction are arranged in the X-direction. The plurality of penetrating electrodes CC2 arranged in the Y-direction are connected to each of the plurality of electrodes 232a. In the example of FIG. 21A, a plurality of electrodes 233a extending in the Y-direction are arranged in the X-direction. The plurality of penetrating electrodes CC3 arranged in the Y-direction are connected to each of the plurality of electrodes 233a. The electrodes 233a are provided between two electrodes 232a adjacent in the X-direction. One ends of the plurality of electrodes 232a in the Y-direction are commonly connected to an electrode 232b extending in the X-direction. Similarly, one ends of the plurality of electrodes 233a in the Y-direction are commonly connected to an electrode 233b extending in the X-direction. The plurality of electrodes 232a and 232b make up the wiring 232. The plurality of electrodes 233a and 233b make up the wiring 233.

In the example of FIG. 21B, the wirings 432 and 433 are formed in a comb shape. That is, in the example of FIG. 21B, a plurality of electrodes 432a extending in the Y-direction are arranged in the X-direction. The plurality of penetrating electrodes CC2 arranged in the Y-direction are connected to each of the plurality of electrodes 432a. In the example of FIG. 21B, a plurality of electrodes 433a extending in the Y-direction are arranged in the X-direction. The plurality of penetrating electrodes CC3 arranged in the Y-direction are connected to each of the plurality of electrodes 433a. The electrodes 433a are provided between two electrodes 432a adjacent in the X-direction. One ends of the plurality of electrodes 432a in the Y-direction are commonly connected to an electrode 432b extending in the X-direction. Similarly, one ends of the plurality of electrodes 433a in the Y-direction are commonly connected to an electrode 433b extending in the X-direction. The plurality of electrodes 432a and 432b make up the wiring 432. The plurality of electrodes 433a and 433b make up the wiring 433.

Figure 22:
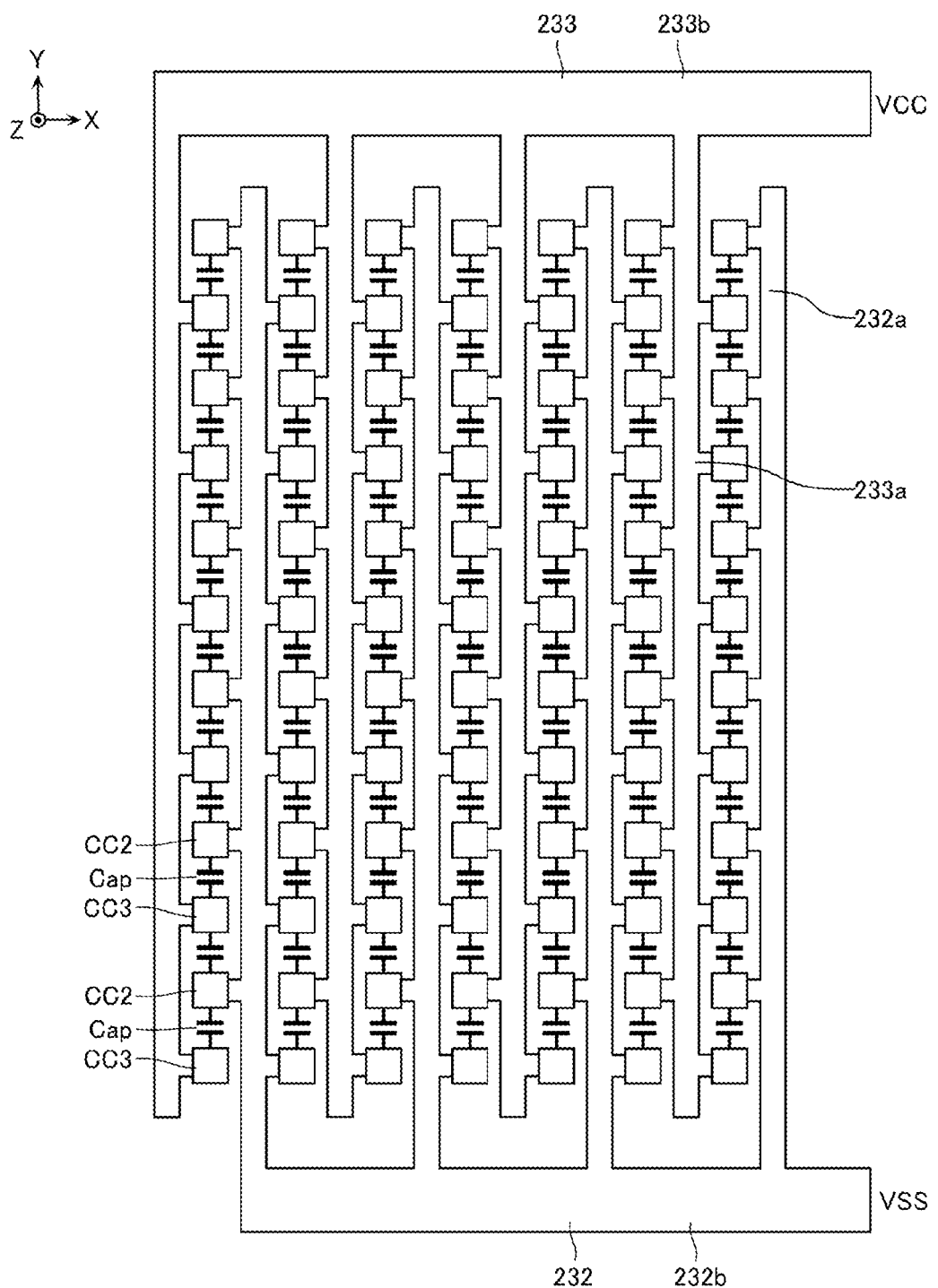
FIG. 22 is a schematic view illustrating another example of wirings connected to the capacitive element formed in the semiconductor storage device.

FIG. 22 is a schematic XY cross-sectional view illustrating another configuration example of the wirings 232 and 233. Although FIG. 22 illustrates a configuration example of the wirings 232 and 233, the wirings 432 and 433 also may have the configuration illustrated in FIG. 22.

In the example of FIG. 22, the wirings 232 and 233 are formed in a comb shape. That is, in the example of FIG. 22, the plurality of electrodes 232a extending in the Y-direction are arranged in the X-direction. In the example of FIG. 22, the plurality of electrodes 233a extending in the Y-direction are arranged in the X-direction. One electrode 233a is provided between each two adjacent electrodes 232a in the X-direction. Further, the plurality of penetrating electrodes CC2 and CC3 are alternately arranged in the Y-direction and are provided between the electrodes 232a and 233a adjacent in the X-direction. Each of the plurality of penetrating electrodes CC2 is connected to the electrode 232a. Each of the plurality of penetrating electrodes CC3 is connected to the electrodes 233a. One ends of the plurality of electrodes 232a in the Y-direction are commonly connected to the electrode 232b extending in the X-direction. Similarly, one ends of the plurality of electrodes 233a in the Y-direction are commonly connected to the electrode 233b extending in the X-direction. The plurality of electrodes 232a and 232b make up the wiring 232. The plurality of electrodes 233a and 233b make up the wiring 233.

Relationship between Regions R12a and R22a

Figure 23:
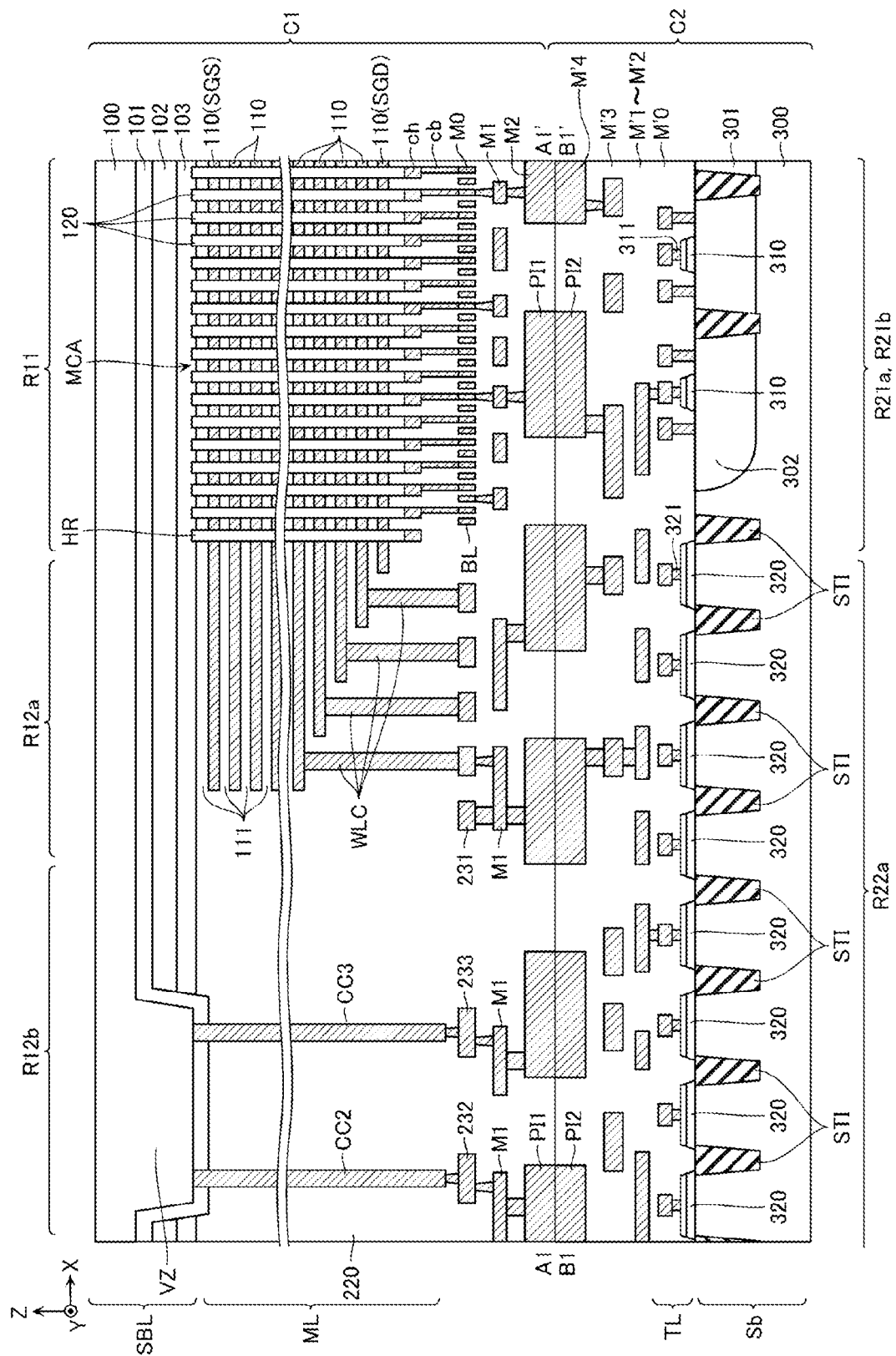
FIG. 23 is a schematic sectional view illustrating a first modified example of the semiconductor storage device.

In the example of FIG. 9, the region R12a of the first chip C1 is provided in a region facing the region R22a of the second chip C2, and the area of the region R12a and the area of the region R22a were approximately the same. However, for example, as illustrated in FIG. 23, the area of the region R12a can be made smaller than the area of the region R22a by reducing a circuit area of the configuration in the region R12a of the first chip C1. With this configuration, it is possible to increase capacitance of the capacitive element Cap by making the area of the region R12b relatively large and increasing the number of penetrating electrodes CC2 and CC3. In such a case, for example, as illustrated in FIG. 23, a part of the region R12b may face the region R22a.

Configuration Example of Base Layer SBL

In the example of FIG. 10A, the base layer SBL of the first chip C1 includes the insulating layer 100, the insulating layer 101, the N-type well layer 102, and the P-type well layer 103. However, such a configuration is merely an example, and can be appropriately adjusted.

Figure 24:
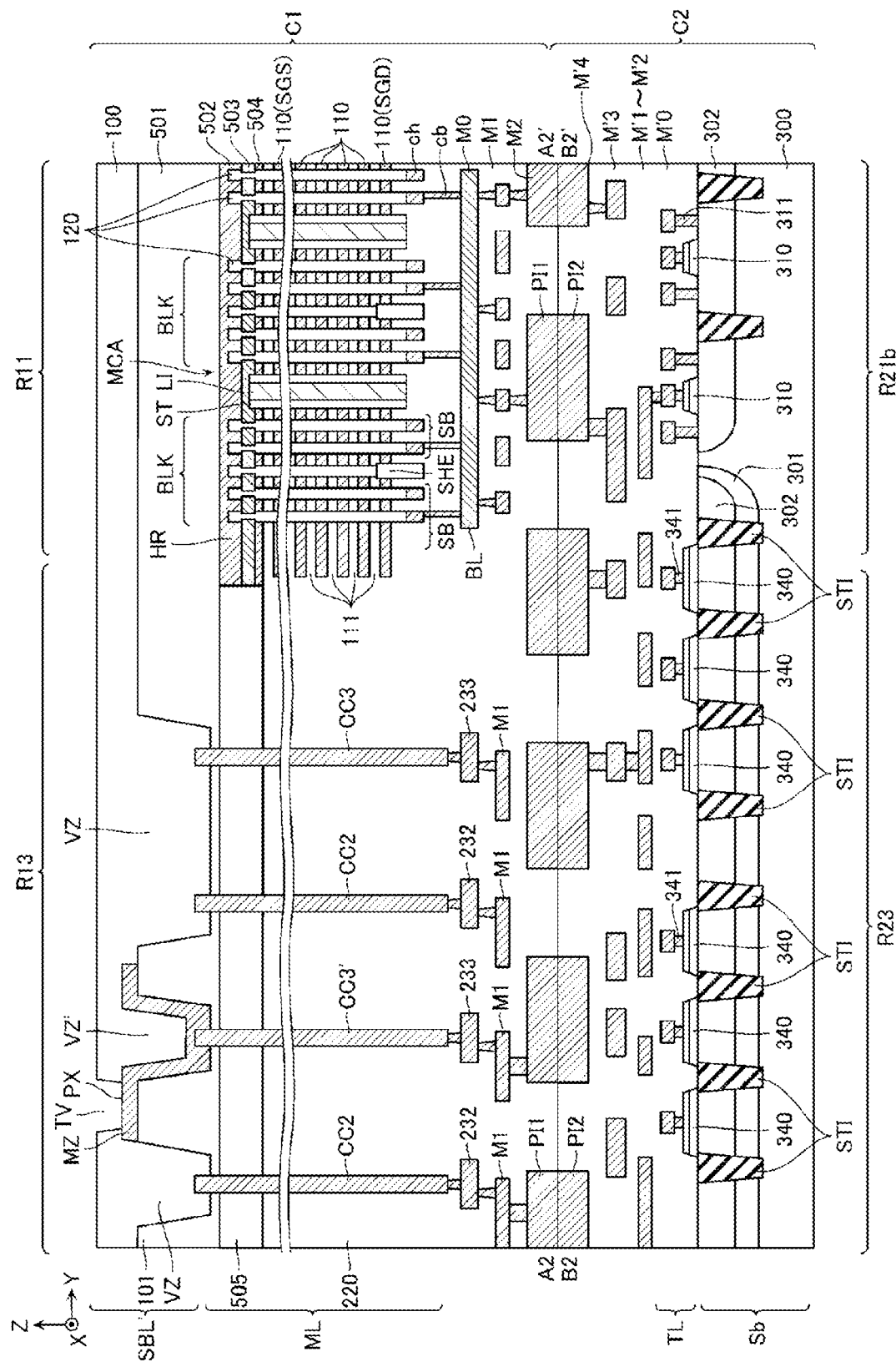
FIG. 24 is a schematic sectional view illustrating a second modified example of the semiconductor storage device.

For example, a base layer SBL' illustrated in FIG. 24 includes the insulating layer 100 and an insulating layer 501 provided in this order from the rear surface side of the first chip C1. In the region R11 of the base layer SBL', a conductive layer 502, a conductive layer 503, and a conductive layer 504 are provided. An insulating layer 505 is provided in a region other than the region R11.

The insulating layer 501 includes, for example, an insulating single-layer film such as silicon oxide or silicon nitride, or a stacked layer including a plurality of insulating films such as silicon oxide and silicon nitride. The insulating layer 501 functions as a passivation film on the rear surface side of the first chip C1.

The conductive layers 502, 503, and 504 function as the wiring SC of the semiconductor pillar 120. The conductive layers 502, 503, and 504 contain, for example, a conductive material such as polycrystalline silicon containing n-type impurities such as phosphorus (P). The conductive layer 503 is connected to the outer peripheral surface of the semiconductor pillar 120. The conductive layer 502 and the conductive layer 504 are connected respectively to the conductive layer 503.

The insulating layer 505 contains an insulating material such as, for example, silicon oxide ($SiO_2$).

Figure 25:
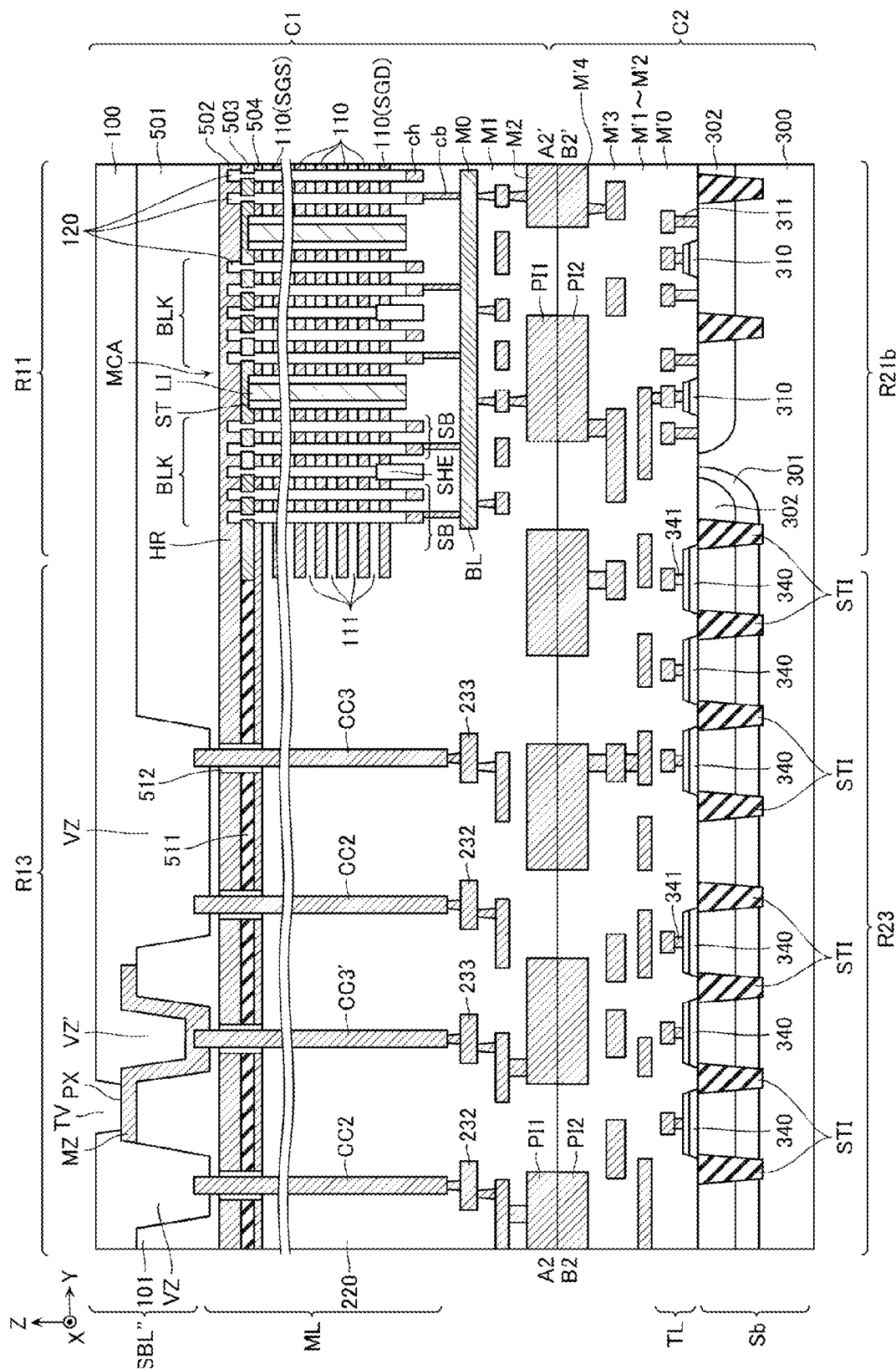
FIG. 25 is a schematic sectional view illustrating a third modified example of the semiconductor storage device.

Also, for example, a base layer SBL" illustrated in FIG. 25 has basically the same configuration as the base layer SBL' illustrated in FIG. 24. However, the insulating layer 505 is not provided in a region other than the region R11 of the base layer SBL" illustrated in FIG. 25, and the conductive layer 502, a stacked film 511, and the conductive layer 504 are provided instead of the insulating layer 505. The stacked film 511 includes, for example, a silicon oxide layer, a polycrystalline silicon layer, and a silicon oxide layer. The conductive layer 502, the conductive layer 504, and the stacked film 511 are insulated from the penetrating electrodes CC2 and CC3 via an insulating film 512 such as silicon oxide.

Other Embodiments

In the description described as above, an example in which the bypass capacitor is formed using the penetrating electrodes CC2 and CC3 was described. However, for example, a capacitor other than the bypass capacitor may also be formed using the penetrating electrodes CC2 and CC3. For example, a capacitor in a charge pump circuit may also be configured using the penetrating electrodes CC2 and CC3. Here, for example, as described above, the region R12b is provided near the row decoder RD. The external pad electrode PX is provided in the region R13. Accordingly, for example, the capacitor in the charge pump may be formed using the plurality of penetrating electrodes CC2 and CC3 provided in the region R12b, and the bypass capacitor may be formed using the plurality of penetrating electrodes CC2 and CC3 provided in the region R13.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a plurality of chips connected to each other, wherein:
   one of the chips includes
      a memory layer including a plurality of first conductive layers arranged in a first direction,
      a plurality of first contacts extending in the first direction and connected to the plurality of first conductive layers,
      a plurality of second contacts extending in the first direction and connected to a first node, and
      a plurality of third contacts extending in the first direction and connected to a second node;
   another one of the chips includes
      a semiconductor substrate having a front surface that intersects the first direction,
      a plurality of transistors provided on the front surface of the semiconductor substrate, and
      a plurality of fourth contacts extending in the first direction and connected to the plurality of transistors;
   the plurality of first contacts are electrically connected to the plurality of fourth contacts respectively; and
   the plurality of second contacts face the plurality of third contacts in a direction crossing the first direction.

2. The semiconductor storage device according to claim 1, wherein at least part of the plurality of first contacts, at least part of the plurality of second contacts, and at least part of the plurality of third contacts are provided at a level of the memory layer in the first direction.

3. The semiconductor storage device according to claim 1, further comprising
   a first power supply electrode provided on one of the chips, and connected to the first node, and
   a second power supply electrode provided on the one of the chips, and connected to the second node.

4. The semiconductor storage device according to claim 3, wherein during operation, the first power supply electrode is connected to ground, and the second power supply electrode is connected to a power source.

5. The semiconductor storage device according to claim 1, wherein the first node and the second node are provided in a charge pump circuit.

6. The semiconductor storage device according to claim 1, wherein:
the one of the chips includes
a plurality of first bonding electrodes connected to the plurality of first conductive layers via the plurality of first contacts;
the another one of the chips includes
a plurality of second bonding electrodes connected to the plurality of transistors via the plurality of fourth contacts; and
the plurality of first bonding electrodes face and are connected to the plurality of second bonding electrodes.

7. The semiconductor storage device according to claim 1, wherein lengths of the plurality of second contacts and the plurality of third contacts in the first direction are each longer than each length of the plurality of fourth contacts in the first direction.

8. The semiconductor storage device according to claim 1, wherein lengths of the plurality of second contacts and the plurality of third contacts in the first direction are each longer than a length of one of the plurality of first contacts in the first direction.

9. The semiconductor storage device according to claim 1, wherein the plurality of second contacts and the plurality of third contacts respectively penetrate a stacked layer.

10. The semiconductor storage device according to claim 1, wherein the plurality of second contacts and the plurality of third contacts respectively penetrate a stacked layer including a plurality of silicon oxide layers and a plurality of silicon nitride layers.

11. The semiconductor storage device according to claim 1, wherein first ends of the plurality of second contacts in the first direction and first ends of the plurality of third contacts in the first direction are respectively connected to first and second wirings in a first wiring layer that is between the memory layer and the another one of the chips in the first direction.

12. The semiconductor storage device according to claim 11, wherein
the first and second wirings extend parallel to each other in a second direction parallel to the front surface, and
the second contacts are each joined to the first wiring at respective first locations and the third contacts are each joined to the second wiring at respective second locations that are aligned with the respective first locations along a third direction that crosses the second direction and is parallel to the front surface.

13. The semiconductor storage device according to claim 11, wherein
the one of the chips includes a second wiring layer farther from the semiconductor substrate than the plurality of first conductive layers, and
second ends of the plurality of second contacts in the first direction and second ends of the plurality of third contacts in the first direction are respectively connected to third and fourth wirings in the second wiring layer.

14. The semiconductor storage device according to claim 11, wherein
the first and second wirings extend parallel to each other in a second direction parallel to the front surface, the first wiring including a plurality of first mounting arms that protrude in a third direction crossing the second direction and parallel to the front surface, and the second wiring including a plurality of second mounting arms that protrude in a direction opposite to the third direction, and
the second contacts are each joined to respective first mounting arms of the first wiring and the third contacts are each joined to the respective second mounting arms of the second wiring.

15. The semiconductor storage device according to claim 11, wherein
the one of the chips includes an insulating layer farther from the semiconductor substrate than all the plurality of first conductive layers, and
second ends of the plurality of second contacts in the first direction and second ends of the plurality of third contacts in the first direction are connected to the insulating layer.

16. The semiconductor storage device according to claim 11, wherein
the one of the chips includes a semiconductor layer farther from the semiconductor substrate than the plurality of first conductive layers, and
second ends of the plurality of second contacts in the first direction and seconds ends of the plurality of third contacts in the first direction are connected to the semiconductor layer.

17. The semiconductor storage device according to claim 1, wherein
a capacitive element is formed by the second and third contacts that face each other in the direction crossing the first direction, and includes a plurality of capacitors, each of which has one of the second contacts as a first electrode thereof and one of the third contacts as a second electrode thereof.

18. The semiconductor storage device according to claim 17, further comprising
a plurality of fifth contacts extending in the first direction, and directly below and connected to a first power supply electrode, and
a plurality of sixth contacts extending in the first direction, and directly below and connected to a second power supply electrode.

19. The semiconductor storage device according to claim 18, wherein
the number of the second and third contacts that make up the capacitive element is greater than the number of the fifth contacts.

20. The semiconductor storage device according to claim 18, wherein
a distance between the one of the second contacts and the one of the third contacts is same or narrower than an interval of the fifth contacts.

* * * * *